(12) United States Patent
Sui et al.

(10) Patent No.: US 12,730,172 B2
(45) Date of Patent: Sep. 8, 2026

(54) ESTIMATING MOTION OF A SUBJECT FROM SLICES ACQUIRED DURING AN MRI SCAN

(71) Applicant: Children's Medical Center Corporation, Boston, MA (US)

(72) Inventors: Yao Sui, Boston, MA (US); Onur Afacan, Boston, MA (US); Ali Gholipour-Baboli, Boston, MA (US); Simon K. Warfield, Boston, MA (US)

(73) Assignee: Children's Medical Center Corporation, Boston, MA (US)

( * ) Notice: Subject to any disclaimer, the term of this patent is extended or adjusted under 35 U.S.C. 154(b) by 16 days.

(21) Appl. No.: 18/685,777

(22) PCT Filed: Aug. 19, 2022

(86) PCT No.: PCT/US2022/040900
§ 371 (c)(1),
(2) Date: Feb. 22, 2024

(87) PCT Pub. No.: WO2023/027958
PCT Pub. Date: Mar. 2, 2023

(65) Prior Publication Data
US 2024/0353517 A1 Oct. 24, 2024

Related U.S. Application Data

(60) Provisional application No. 63/236,073, filed on Aug. 23, 2021.

(51) Int. Cl.
*G01R 33/565* (2006.01)
*G01R 33/48* (2006.01)
(Continued)

(52) U.S. Cl.
CPC ... *G01R 33/56509* (2013.01); *G01R 33/4806* (2013.01); *G01R 33/4835* (2013.01); *G01R 33/5608* (2013.01)

(58) Field of Classification Search
CPC ............ G01R 33/565; G01R 33/56308; G06T 7/0012; A61B 2090/364
See application file for complete search history.

(56) References Cited

U.S. PATENT DOCUMENTS 7,423,430 B1 9/2008 Sharif
9,524,567 B1 12/2016 Brokish et al.
(Continued)

FOREIGN PATENT DOCUMENTS

WO 2020078907 A1 4/2020
WO 2020219803 A1 10/2020
(Continued)

OTHER PUBLICATIONS

Wang et al., "CONtrast Conformed Electrical Properties Tomography (CONCEPT) Based on Multi-Channel Transmission and Alternating Direction Method of Multipliers", IEEE Transactions on Medical Imaging, Author Manuscript, PMC, Feb. 1, 2020, 33 pages.
(Continued)

*Primary Examiner* — Eman A Alkafawi
*Assistant Examiner* — Suresh K Rajaputra
(74) *Attorney, Agent, or Firm* — Greenberg Traurig, LLP; Andrew J. Tibbetts; George E. Banis

(57) ABSTRACT

Described herein are techniques to estimate motion of a subject during a magnetic resonance image (MRI) scan. The estimation may be based on one or more slices acquired during the MRI scan, permitting automated estimation of motion of the subject during the MRI scan. Some such techniques may be performed during the MRI scan, before the completion of the MRI scan, or after the MRI scan before
(Continued)

or after magnetic resonance data (MR data) resulting from the MRI scan has been processed to generate an image from the MR data.

18 Claims, 13 Drawing Sheets

(51) Int. Cl.
*G01R 33/483* (2006.01)
*G01R 33/56* (2006.01)

(56) References Cited

U.S. PATENT DOCUMENTS

2002/0039024 A1 4/2002 Fuderer
2005/0058368 A1 3/2005 Moriguchi
2005/0189942 A1 9/2005 Tsao
2006/0261809 A1 11/2006 Fuderer et al.
2008/0317315 A1* 12/2008 Stemmer .......... G01R 33/56509 382/131
2010/0284595 A1 11/2010 Mori et al.
2012/0082355 A1 4/2012 Mendes
2012/0249138 A1 10/2012 Pfeuffer
2013/0076356 A1 3/2013 Jellus et al.
2013/0137968 A1* 5/2013 Reisman .......... G01R 33/56563 324/309
2013/0229177 A1 9/2013 Bammer et al.
2013/0230228 A1* 9/2013 Leung .................. G06T 7/0012 382/132
2013/0249553 A1 9/2013 Simonetti et al.
2013/0259343 A1 10/2013 Liu
2013/0300414 A1 11/2013 Guerin
2013/0320974 A1 12/2013 Liu
2014/0009156 A1 1/2014 Doneva et al.
2014/0361770 A1 12/2014 Dannels
2015/0065854 A1 3/2015 Ahn et al.
2015/0369893 A1 12/2015 Takeshima
2016/0252596 A1 9/2016 Nielsen et al.
2017/0325709 A1 11/2017 Nayak
2018/0024215 A1 1/2018 Zhu
2018/0232878 A1 8/2018 Braun et al.
2018/0238986 A1 8/2018 DeWeerdt
2018/0238988 A1 8/2018 Bernstein
2018/0260981 A1* 9/2018 Gholipour-Baboli ........................ G01R 33/56341
2018/0306882 A1 10/2018 Li
2019/0122398 A1 4/2019 Huang
2019/0244399 A1 8/2019 Li
2021/0046329 A1* 2/2021 Lachaine .................. G06T 7/33
2021/0196109 A1 7/2021 Shelton, IV et al.
2022/0218222 A1 7/2022 Kermani et al.

FOREIGN PATENT DOCUMENTS

WO 2021/099282 A1 5/2021
WO 2023004412 A1 1/2023
WO 2023027958 A1 3/2023
WO 2023034044 A1 3/2023

OTHER PUBLICATIONS

International Search Report and Written Opinion from the International Searching Authority from corresponding PCT Application No. PCT/US2022/040900, dated Dec. 6, 2022, By: Authorized Officer: Kari Rodriquez.

* cited by examiner

ESTIMATING MOTION OF A SUBJECT FROM SLICES ACQUIRED DURING AN MRI SCAN

CROSS-REFERENCE TO RELATED APPLICATIONS

The present application is the U.S. National Stage application, pursuant to 35 U.S.C. § 371, of PCT International Patent Application No. PCT/US2022/040900, filed Aug. 19, 2022, designating the United States and published in English, which claims the benefit under 35 U.S.C. § 119 (e) of U.S. Provisional Application No. 63/236,073, filed Aug. 23, 2021, and titled "Estimating motion of a subject from slices acquired during an MRI scan," the entire contents of each of which are incorporated herein by reference.

FEDERALLY SPONSORED RESEARCH

This invention was made with government support under Grant Numbers EB019483, NS079788, NS106030, DK100404, and MH086984, awarded by the National Institutes of Health. The government has certain rights in the invention.

BACKGROUND OF INVENTION

Magnetic resonance imaging (MRI) is a non-invasive and versatile technique for imaging biological systems. Generally, MRI operates by detecting magnetic resonance (MR) signals, which are electromagnetic waves emitted by atoms in response to an applied electromagnetic field. The detected MR signals may then be used to generate images of tissues of a subject, usually internal to the subject and unable to be directly viewed without invasive surgery.

SUMMARY OF INVENTION

In one embodiment, there is provided a method comprising: estimating motion of a subject during a magnetic resonance image (MRI) scan based on a slice acquired during the MRI scan, the estimating comprising aligning the slice to a reference volume prior to acquiring a subsequent slice during the MRI scan; and outputting an indication of the estimated motion of the subject.

In another embodiment, there is provided a system comprising: at least one processor; and at least one non-transitory computer-readable storage medium storing processor-executable instructions that, when executed by the at least one processor, cause the at least one processor to perform: estimating motion of a subject during a magnetic resonance image (MRI) scan based on a slice acquired during the MRI scan, the estimating comprising aligning the slice to a reference volume prior to acquiring a subsequent slice during the MRI scan; and outputting an indication of the estimated motion of the subject.

In another embodiment, there is provided a magnetic resonance imaging (MRI) system comprising: an MRI scanner; at least one computer hardware processor; and at least one non-transitory computer-readable storage medium storing processor executable instructions that, when executed by the at least one computer hardware processor, cause the at least one computer hardware processor to perform: estimating motion of a subject during a magnetic resonance image (MRI) scan based on a slice acquired during the MRI scan, the estimating comprising aligning the slice to a reference volume prior to acquiring a subsequent slice during the MRI scan; and outputting an indication of the estimated motion of the subject.

In another embodiment, there is provided a method comprising: prior acquiring a subsequent slice during a magnetic resonance image (MRI) scan, evaluating a first slice acquired during the MRI scan; determining a quality of volumetric MRI data that would result from the MRI scan based at least in part on a result of evaluating the first slice; and outputting an indication of the quality of the volumetric MRI data.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION OF INVENTION

Figure 1:
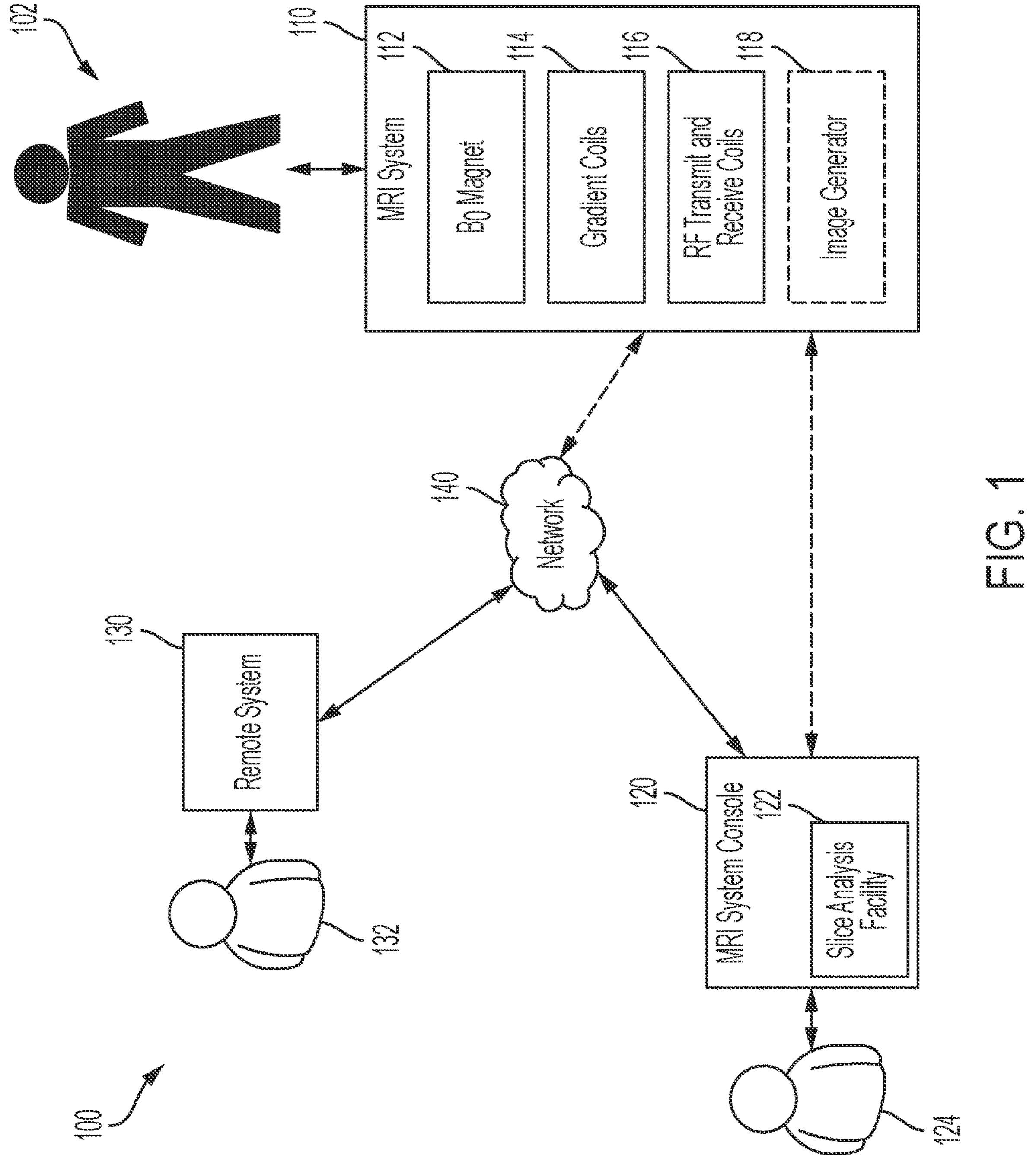
FIG. 1 is a schematic diagram of a magnetic resonance imaging (MRI) facility for evaluating at least a portion of an MRI scan, in accordance with some embodiments of the technology described herein.

Described herein are techniques to estimate motion of a subject during a magnetic resonance imaging (MRI) scan. In some embodiments described herein, the techniques may be used together with an MRI sequence in which the scan is performed as a set of slices (captured one-by-one or with two or more slices acquired in parallel). Such slice-by-slice scans may include functional MRI (fMRI) or diffusion MRI, among others. The motion estimation may be based on an alignment of an acquired slice to a reference volume, the slice having been acquired by an MRI system during the MRI scan and the reference volume having been acquired prior to the start of the MRI scan or at an initialization phase prior to or at the beginning of the MRI scan. The slice-to-volume alignment for a slice may be performed prior to the acquisition of a subsequent slice, such as prior to acquisition of the slice immediately following the acquired slice. As a result, the techniques permit estimation of motion of the subject on a slice-by-slice basis, during an MRI scan.

Such techniques may be useful to imaging technologists and radiologists by providing insights into subject motion at the slice level, prior to completion of the MRI scan. These insights can be used to guide interventions for preventing further subject movements, to determine the duration of the MRI scan for collecting sufficient data, to update MRI parameters for prospectively correcting for the estimated motion (e.g., by steering the MRI scan), and to retrospectively correct the MR data based on the estimated motion. For example, an indication of the estimated motion may be output to the imaging technologist or radiologist. The indication may be qualitative or quantitative and may be a binary indication (motion-corrupt or non-motion-corrupt) or may indicate a degree of motion, as embodiments are not limited in this respect. In some embodiments, the output may recommend an intervention, such as providing feedback to the subject or acquiring additional data. In some embodiments, the output indicating the estimated motion may be used to prospectively or retrospectively correct for the motion in the MR data that has been or that will be acquired during the MRI scan.

The inventors have recognized and appreciated that estimating motion based on an analysis of a volume (e.g., an organ or other three-dimensional structure within the subject, that may be acquired as an output of an MRI sequence including multiple acquisitions) acquired during an MRI can be ineffective for accounting for the fast and frequent motion that happens with non-cooperative subjects. In contrast, using a slice according to the techniques described herein may enable motion estimation at a slice level, allowing for detection and correction of the fast and frequent movement that occurs over the course of volume acquisition.

An approach of acquiring a slice during an MRI scan, aligning the slice to a reference volume, and estimating motion based on the results of the alignment may offer distinct advantages and increased accuracy over conventional approaches, as described below.

MRI is a non-invasive, versatile technique for studying physiology and pathology of a subject, such as a human subject or other animal subject. Different types of MRI techniques are used to generate images for studying specific structures and functions. Functional MRI (fMRI) and diffusion MRI are two MRI techniques that can be used to generate image data for studying anatomical structures. fMRI measures the small changes in blood flow that occur with metabolic activity, while diffusion MRI assesses the microstructural properties of tissue based on the dispersion of water molecules. These can be used, for example, to study small structures within the brain or brain activity.

Both these MRI techniques (fMRI and diffusion) involve acquiring volumetric image data, which can include acquiring a volume or multiple volumes over a duration of time. Each such volume can be acquired through acquiring, during an MRI sequence, multiple contiguous slices through a region of the imaged structure. Each slice may be a narrow image of the whole tissue/structure to be imaged, such that multiple slices when assembled depict the whole tissue/structure. Activity occurring in the anatomical structure may be studied by observing changes and patterns across the acquired volumes.

Generating MRI data that is sufficient for accurate analysis may depend on the stillness of the subject being scanned. Due to the architecture of many MRI scanners, it can be difficult for an operator to see if the subject in the MRI machine is moving, preventing the operator from providing instructions to the subject to keep still. Motion of a subject during an MRI scan can result in image artifacts including ghosting, blurring, and signal dropout that can significantly degrade data quality. Motion of a subject during fMRI can disrupt the blood oxygenation level dependent (BOLD) signal measurement, which is used for measuring neural activity. Such motion effects can be subtle and not easy to identify during acquisition but can jeopardize imaging quality. To increase the likelihood of acquiring motion-free data, the imaging technologist or radiologist may acquire additional data (e.g., additional volumes), in the hopes that at least one of the acquired volumes will be motion-free. Acquiring more data undesirably increases the duration of the scan, which is inconvenient for the subject and hospital, and increases costs for the hospital. Moreover, this strategy does not ensure that motion-free data will be acquired. Consequently, it may be necessary to repeat the MRI scan and, in some cases, sedate the subject during the repeated MRI scans to keep them still. Both strategies increase the emotional and physical burden on the subject, in addition to significantly increasing clinical and research costs.

Conventionally, motion monitoring techniques are employed in an attempt to estimate motion during an MRI scan. However, these techniques have limitations and do not address the above-identified issues associated with motion in MRI. For example, volume-to-volume registration (VVR) techniques have been used monitor motion by measuring the misalignment between two volumes, one captured subsequent to the other. However, motion is not limited to occurring at the boundaries between two volume acquisitions, but instead may occur at any time. VVR techniques do not account for fast and frequent motion that often occurs during acquisition of a single volume. Consequently, the VVR techniques do not effectively measure or correct for motion that occurs during imaging of a volume. To address these limitations, retrospective slice-to-volume (SVR) registration techniques have been used to retrospectively (following capture of a volume) estimate motion on a slice-by-slice basis and then perform motion compensation on the captured data. These techniques do not effectively address the above-described disadvantages associated with motion during an MRI scan. Since the SVR techniques are retrospective, the motion compensation techniques are only executed following acquisition of data and the techniques still rely on the acquisition of data of sufficient quality that would yield usable data following the motion compensation. Data may be acquired that is of low enough quality that data cannot be used even after motion compensation. And the techniques require a great deal of processing time, disadvantageously extending the period of scanning or requiring a subject leave and then, if needed, return to be scanned again. The existing retrospective SVR techniques therefore do not alleviate the increased burden on the subject, or the temporal and monetary costs associated with collecting such data.

The inventors have recognized and appreciated that such challenges and inefficiencies may be mitigated by automated systems to estimate motion of a subject at a slice level and provide an indication of the estimated motion prior to the acquisition of a next slice.

The inventors have accordingly developed systems and methods for estimating motion of a subject during an MRI scan. In some embodiments, estimating the motion of the subject includes acquiring a slice and aligning the acquired slice to a reference volume. The slice may be aligned to the reference volume prior to the acquisition of the slice immediately following the acquired slice. The techniques may include estimating the motion of the subject based on the results of the alignment of the slice to the reference volume and outputting an indication of the estimated motion.

Accordingly, some embodiments provide for aligning a slice to a reference volume. The method includes comparing the acquired slice to a slice extracted from the reference volume. In some embodiments, the comparing includes determining a degree of similarity between the slices based on matching criteria. For example, the techniques may quantify similarities based on voxel intensities and/or correspondences between anatomical locations or salient images. Some embodiments provide for a method of generating a reference volume. The method may include acquiring a first volume and aligning slices from a second volume to the first volume to estimate motion of those slices. In some embodiments, the first volume is identified as the reference volume when none of the aligned slices are associated with an estimated motion that exceeds a threshold. For example, if the motion estimated for each slice associated with the second volume falls below the threshold, this may indicate no motion occurred between acquisition of both volumes.

Various examples of ways in which these techniques and systems can be implemented are described below. It should be appreciated, however, that embodiments are not limited to operating in accordance with these examples. Other embodiments are possible.

FIG. 1 is a block diagram of an example system 100 for evaluating MR data acquired during an MRI scan to make estimations regarding motion of the subject during the MRI scan, in accordance with some embodiments of the technology described herein. In the illustrative example of FIG. 1, system 100 includes an MRI system 110, an MRI system console 120, and a remote system 130. It should be appreciated that system 100 is illustrative and that a system may have one or more other components of any suitable type in addition to or instead of the components illustrated in FIG. 1. For example, there may be additional remote systems (e.g., two or more) present within a system.

As illustrated in FIG. 1, in some embodiments, one or more of the MRI system 110, the MRI system console 120, and the remote system 130 may be communicatively connected by a network 140. The network 140 may be or include one or more local and/or wide-area, wired, and/or wireless networks, including a local-area or wide-area enterprise network and/or the Internet. Accordingly, the network 140 may be, for example, a hard-wired network (e.g., a local area network within a healthcare facility), a wireless network (e.g., connected over Wi-Fi and/or cellular networks), a cloud-based computing network, or any combination thereof. For example, in some embodiments, the MRI system 110 and the MRI system console 120 may be located within the same healthcare facility and connected directly to each other or connected to each other via the network 140, while the remote system 130 may be located in a remote healthcare facility and connected to the MRI system 110 and/or the MRI system console 120 through the network 140.

In some embodiments, the MRI system 110 may be configured to perform MR imaging of anatomy of a subject 102. For example, the MRI system 110 may include a B0 magnet 112, gradient coils 114, and radio frequency (RF) transmit and receive coils 116 configured to act in concert to perform said MR imaging.

In some embodiments, B0 magnet 112 may be configured to generate the main static magnetic field, B0, during MR imaging. The B0 magnet 112 may be any suitable type of magnet that can generate a static magnetic field for MR imaging. For example, the B0 magnet 112 may include a superconducting magnet, an electromagnet, and/or a permanent magnet. In some embodiments, the B0 magnet 112 may be configured to generate a static magnetic field having a particular field strength. For example, the B magnet 112 may be a magnet that can generate a static magnetic field having a field strength of 1.5 T, or, in some embodiments, a field strength greater than or equal to 1.5 T and less than or equal to 3.0 T.

In some embodiments, gradient coils 114 may be arranged to provide one or more gradient magnetic fields. For example, gradient coils 114 may be arranged to provide gradient magnetic fields along three substantially orthogonal directions (e.g., x, y, and z). The gradient magnetic fields may be configured to, for example, provide spatial encoding of MR signals during MR imaging. Gradient coils 114 may comprise any suitable electromagnetic coils, including discrete wire windings coils and/or laminate panel coils.

In some embodiments, RF transmit and receive coils 116 may be configured to generate RF pulses to induce an oscillating magnetic field, B1, and/or to receive MR signals from nuclear spins within a target region of the imaged subject during MR imaging. The RF transmit coils may be configured to generate any suitable types of RF pulses useful for performing MR imaging. RF transmit and receive coils 116 may comprise any suitable RF coils, including volume coils and/or surface coils.

In some embodiments, the MRI system 110 may optionally include image generator 118. Image generator 118 may be configured to generate images based on MR data acquired by the MRI system 110 during MR imaging of the subject 102. For example, in some embodiments, image generator 118 may be configured to perform image reconstruction to generate images in the image domain based on MR data in the spatial frequency domain (e.g., MR data comprising data describing k-space).

As illustrated in FIG. 1, MRI facility 100 includes MRI system console 120 communicatively coupled to the MRI system 110. MRI system console 120 may be any suitable electronic device configured to send instructions and/or information to MRI system 110, to receive information from MRI system 110, and/or to process obtained MR data. In some embodiments, MRI system console 120 may be a fixed electronic device such as a desktop computer, a rack-mounted computer, or any other suitable fixed electronic device. Alternatively, MRI system console 120 may be a portable device such as a laptop computer, a smart phone, a tablet computer, or any other portable device that may be configured to send instructions and/or information to MRI system 110, to receive information from MRI system 110, and/or to process obtained MR data.

Some embodiments may include a slice analysis facility 122. Slice analysis facility 122 may be configured to analyze MR data obtained by MRI system 110 from an MR imaging procedure of subject 102. Slice analysis facility 122 may be configured to, for example, analyze the obtained MR data to make one or more determinations regarding estimated motion of a subject during the MRI scan using the MR data, as described herein. Slice analysis facility 122 may be implemented as hardware, software, or any suitable combination of hardware and software, as aspects of the disclosure provided herein are not limited in this respect. As illustrated in FIG. 1, the slice analysis facility 122 may be implemented in the MRI system console 120, such as by being implemented in software (e.g., executable instructions) executed by one or more processors of the MRI system console 120. However, in other embodiments, the slice analysis facility 122 may be additionally or alternatively implemented at one or more other elements of the system 100 of FIG. 1. For example, the slice analysis facility 122 may be implemented at the MRI system 110 and/or the remote system 130 discussed below. In other embodiments, the slice analysis facility 122 may be implemented at or with another device, such as a device located remote from the system 100 and receiving data via the network 140.

MRI system console 120 may be accessed by MRI user 124 in order to control MRI system 110 and/or to process MR data obtained by MRI system 110. The MRI user 124 may be, for example, an imaging technologist or an MRI system operator. For example, MRI user 124 may implement an MR imaging process by inputting one or more instructions into MRI system console 120 (e.g., MRI user 124 may select an MR imaging process from among several options presented by MRI system console 120). Alternatively, or additionally, in some embodiments, MRI user 124 may implement an MR data analysis procedure by inputting one or more instructions into MRI system console 120 (e.g., MRI user 124 may select MR data instances to be analyzed by MRI system console 120).

As illustrated in FIG. 1, MRI system console 120 also interacts with remote system 130 through network 140, in some embodiments. Remote system 130 may be any suitable electronic device configured to receive information (e.g., from MRI system 110 and/or MRI system console 120) and to display generated images for viewing. The remote system 130 may be remote from the MRI system 110 and MRI system console 120, such as by being located in a different room, wing, or building of a facility (e.g., a healthcare facility) than the MRI system 110, or being geographically remote from the system 110 and console 120, such as being located in another part of a city, another city, another state or country, etc. In some embodiments, remote system 130 may be a fixed electronic device such as a desktop computer, a rack-mounted computer, or any other suitable fixed electronic device. Alternatively, remote system 130 may be a portable device such as a laptop computer, a smart phone, a tablet computer, or any other portable device that may be configured to receive and view generated images and/or to send instructions and/or information to MRI system console 120.

In some embodiments, remote system 130 may receive information (e.g., MR data analysis results, generated images) from MRI system console 120 and/or MRI system 110 over the network 140. A remote user 132 (e.g., a radiologist or other clinician, such as the subject's medical clinician) may use remote system 130 to view the received information on remote system 130. For example, the remote user 132 may view generated images using remote system 130 after the MRI user 124 has completed MR data analysis using MRI system 110 and/or MRI system console 120.

Figure 2A:
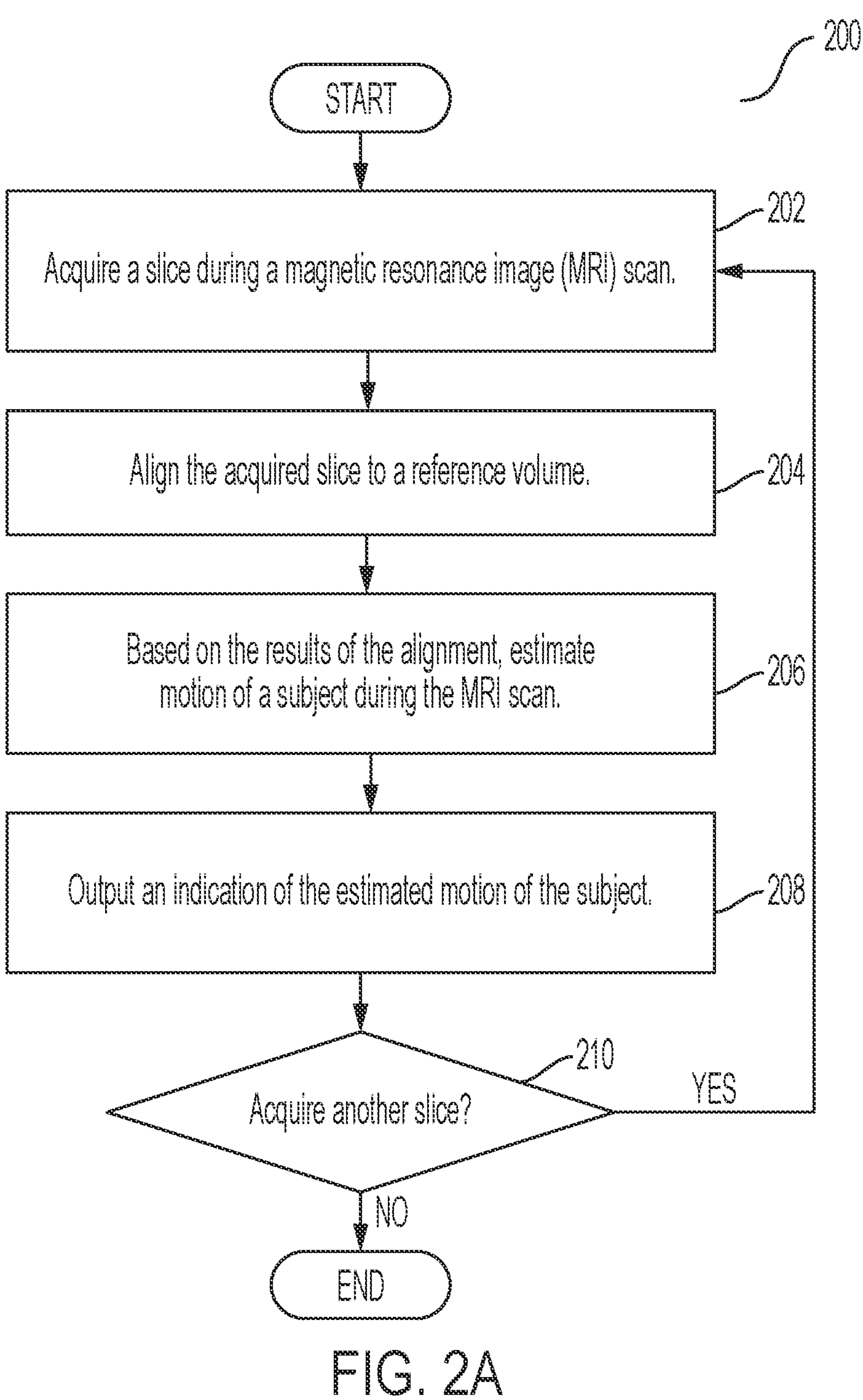
FIG. 2A is a flowchart of an illustrative process 200 of estimating motion of a subject during an MRI scan, in accordance with some embodiments of the technology described herein.

FIG. 2A is a flowchart of an illustrative process 200 for estimating motion of a subject during an MRI scan, in accordance with some embodiments of the technology described herein. Process 200 may be implemented by a slice analysis facility, such as the facility 122 of FIG. 1. As such, in some embodiments, the process 200 may be performed by a computing device configured to send instructions to an MRI system and/or to receive information from an MRI system (e.g., MRI system console 120 executing slice analysis facility 122 as described in connection with FIG. 1). As another example, in some embodiments, the process 200 may be performed by one or more devices/processors located remotely (e.g., as part of a cloud computing environment, as connected through a network) from the MRI system that obtained the input MR data.

Process 200 begins at block 202, where the slice analysis facility instructs the MRI system to acquire a slice during an MRI scan. The MRI scan may be any scan that includes acquiring MR data through a sequence that includes multiple different slices, which may be captured one-by-one or by capturing two or more slices in parallel. Each slice is an image of a narrow piece of an overall tissue or structure to be imaged, such that an aggregation of the slices yields an image of the whole tissue/structure, as a volume image. For example, in some conventional imaging sequences, an MR scan of a human head may be acquired as a set of 50-60 slices.

In some embodiments, acquiring a slice during an MRI scan may include applying a radio frequency pulse (RF) in conjunction with a magnetic field gradient, causing the rotation of spins located in a slice or plane through an object being scanned. In some embodiments, the RF pulse may be a pulse included in an MRI sequence acquired by the MRI system. For example, an MRI sequence may include a function MRI (fMRI) scan, an echo-planar imaging (EPI) scan, a diffusion-weighted imaging (DWI) scan, or any suitable MRI sequence, as aspects of the embodiments described herein are not limited in this respect. In some embodiments, the slice analysis facility may specify parameters for acquiring an MRI sequence. For example, the instructions may specify a repetition time (TR), a time to echo (TE), a number of measurements, a matrix size, a pixel bandwidth, a field of view, an in-plane acceleration factor, a flip angle, or any other suitable parameter, as aspects of the embodiments described herein are not limited in this respect.

In some embodiments, the acquired slice may be one of multiple slices acquired by the MRI system simultaneously. For example, multiple slices may be acquired at simultaneously using simultaneous multi-slice (SMS) acquisition. In some embodiments, when using SMS acquisition, the slice analysis facility may instruct the MRI system to acquire the slices in a specific manner. For example, the instructions may specify that the slices are to be acquired in an interleaved or sequential manner. Interleaved slice acquisition includes acquiring non-sequential slices within a volume, while sequential slice acquisition includes acquiring sequential slices within the volume. In some embodiments, the instructions may specify parameters for acquiring the slices. For example, the parameters may include an interleaving parameter (e.g., a number of slices skipped), an SMS factor, a slice thickness, a number of slices, a slice order, or any other suitable parameter as embodiments described herein are not limited in this respect. After MRI sequence acquisition, the slice analysis facility may receive, from the MRI system, the acquired slice.

At block 204, the slice analysis facility aligns the acquired slice to a reference volume. In some embodiments, aligning the slice to a reference volume may first include determining similarities between the slice and the reference volume. For example, the slice analysis facility may determine similarities between the slice and the reference volume based on similarities between the slice and a slice that is extracted from the reference volume. In some embodiments, one or more matching criteria may relate to, such as by quantifying, a similarity between the slice and the reference volume or at least a portion of the reference volume (e.g., a corresponding slice of the reference volume). For example, the matching criterion may be based on iconic criteria (e.g., voxel intensities), geometric criteria (e.g., correspondences between anatomical locations or salient image regions), or any other suitable criteria, as embodiments described herein are not limited in this respect. In some embodiments, the slice analysis facility may consider more than one slice at a time when determining an alignment. For example, multiple slices that were acquired simultaneously may be aligned to the reference volume at one time. In some embodiments, the results of aligning the slice to the reference volume describe a spatial transformation of data within the slice with respect to corresponding data of the reference volume in a common space. Such data may relate to depicted structures. The transformation may describe a change between a position at which a particular piece of information appears in the MR scan and a position at which the information was expected to appear, based on the reference volume and/or prior data capture during the MR scan. The spatial transformation may, in some embodiments, describe translations and/or rotations of the slice with respect to the reference volume.

In some embodiments, the reference volume may be calibrated in other suitable ways, as embodiments described herein are not limited in this respect. Other example techniques for calibrating a reference volume are described herein including at least with respect to FIG. 2B. Further example techniques for calibrating a reference volume are described by Gholipour, Ali et al. ("Robust super-resolution volume reconstruction from slice acquisitions: application to fetal brain MRI." IEEE transactions on medical imaging vol. 29,10 (2010): 1739-58), the entire contents of which are incorporated by reference herein.

At block 206, based on the results of the alignment, the slice analysis facility estimates motion of a subject during the MRI scan. In some embodiments, estimating the motion may include comparing the spatial transformation of the slice to a spatial transformation for a previously-acquired slice. For example, the previously-acquired slice may include a most-recently acquired slice, prior to the acquisition of the current slice. In some embodiments, changes in the spatial transformations between the slices and/or between the slice and the reference volume may be indicative of motion of the subject. The estimated motion may be quantified using one or more metrics. For example, the estimated motion may be quantified by a slice displacement (SD), which may account for changes in translation and/or rotation between the slices.

In some embodiments, the slice analysis facility evaluates the estimated motion to determine whether it exceeds a specified threshold. For example, a metric indicative of the estimated motion, such as SD, may be compared to the specified threshold. In some embodiments, based on the outcome, the slice analysis facility may classify the slice and/or the volume that would result from the MRI scan. For example, if the estimated motion exceeds the threshold, the slice and/or the volume may be classified as motion-corrupted.

In some embodiments, blocks 204 and/or 206 may be completed prior to the acquisition of a subsequent slice or slices. For example, the subsequent slice may include a slice immediately following the current slice. For example, the alignment of and estimation of motion associated with the current slice(s) may be completed in less time that needed to construct the next slice(s).

At block 208, the slice analysis facility outputs an indication of the estimated motion of the subject. In some embodiments, the slice analysis facility may output an indication at any suitable time prior to or after completion of the MRI scan. For example, the slice analysis facility may output an indication during the MRI scan, prior to image generation. As another example, the slice analysis facility may output an indication during the MRI scan, after the slice analysis facility determines that a slice and/or the volume that would result from the MRI scan is motion-corrupted. In some embodiments, outputting the indication may include displaying metrics indicative of the motion estimated at block 202, through a user interface of the MRI system. Additionally or alternatively, outputting the indication may include providing an intervention recommendation. For example, if the motion estimated at block 202 exceeds a threshold, the slice analysis facility may recommend increasing the duration of the MRI scan to acquire more data that is not corrupted with motion. As another example, based on the estimated motion determined at block 202, the slice analysis facility may recommend that the MRI system operator instruct the subject to keep still.

In some embodiments, based on the output at block 208, the slice analysis facility may perform retrospective and/or prospective motion correction. For example, based on the estimated motion, the slice analysis facility may retrospectively correct image data that results from the MRI scan. As another example, based on the estimated motion, the slice analysis facility may update parameters of the MRI scan to prospectively correct for motion in subsequent slices. In this case, the slice analysis facility may update the parameters prior to acquiring any additional slices.

At block 210, the slice analysis facility determines whether to instruct the MRI system to acquire an additional slice or slices. The slice analysis facility may determine that an additional slice should be acquired for multiple reasons. For example, the current slice may be one slice of multiple slices used to generate a volume. If the current slice is not the last slice, then an additional slice may be acquired. As another example, if the current slice or any previous slices are corrupt with motion, then an additional slice may be acquired to replace the corrupt data. If an additional slice or slices are to be acquired, then the process 200 returns to block 202 for acquiring the slice(s). If an additional slice or slices are not to be acquired, then the process 200 ends.

Figure 2B:
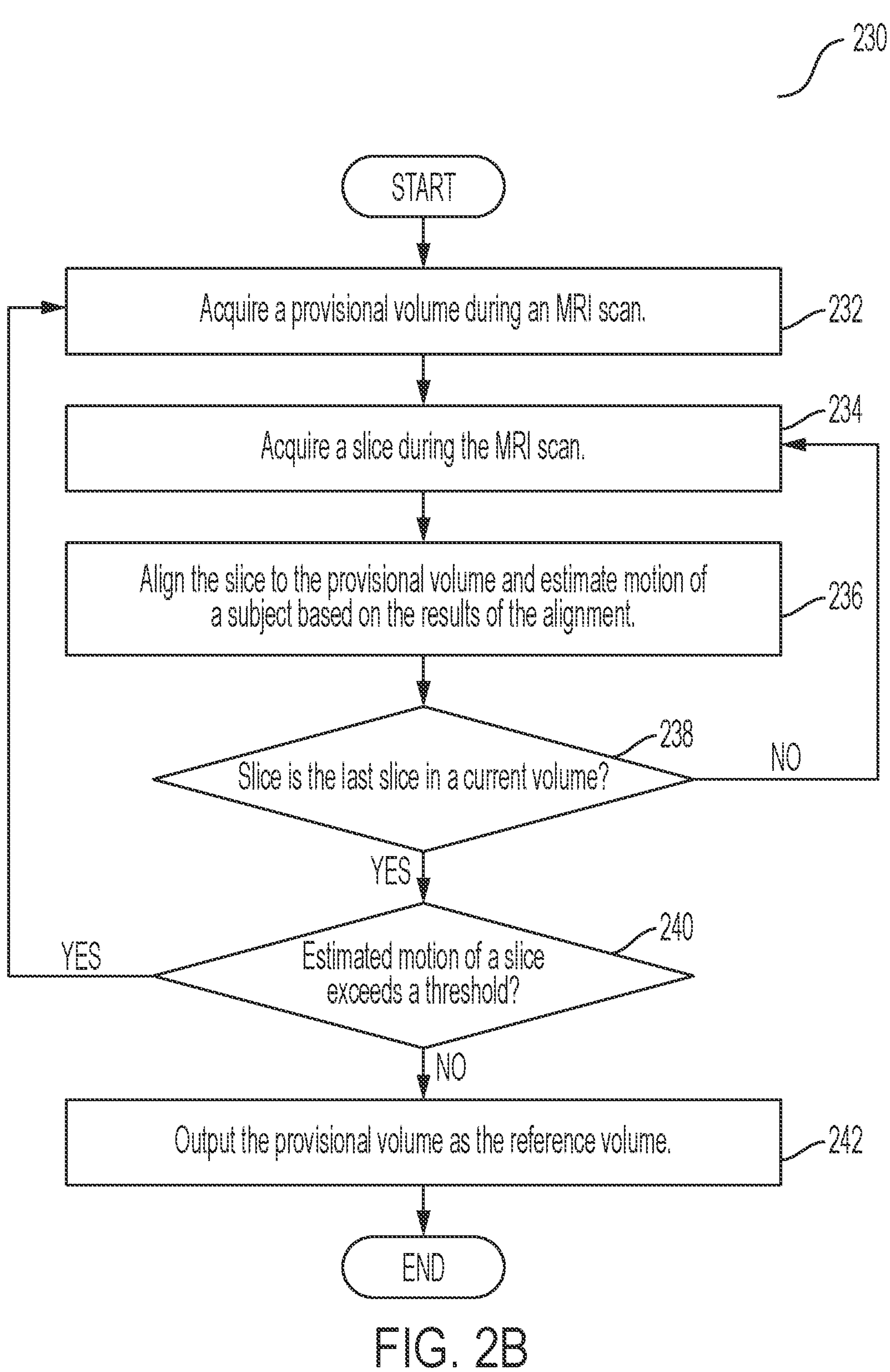
FIG. 2B is a flowchart of an illustrative process 250 of calibrating a reference volume, in accordance with some embodiments of the technology described herein.

FIG. 2B is a flowchart of an illustrative process 230 for calibrating a reference volume, in accordance with some embodiments of the technology described herein. Process 230 may be implemented by a slice analysis facility, such as the facility 122 of FIG. 1. As such, in some embodiments, the process 230 may be performed by a computing device configured to send instructions to an MRI system and/or to receive information from an MRI system (e.g., MRI system console 120 executing slice analysis facility 122 as described in connection with FIG. 1). As another example, in some embodiments, the process 230 may be performed by one or more devices/processors located remotely (e.g., as part of a cloud computing environment, as connected through a network) from the MRI system that obtained the input MR data.

The process 230 proceeds through capturing multiple different volumes in succession then comparing two captured volumes to determine whether any motion (e.g., motion above a tolerance) has been found. If motion is found in a comparison of the two volumes, the process continues with capturing a new volume and comparing the new volume to a previously-imaged volume until the condition is met. As an example for ease of understanding, the process may include performing a scan of a subject to generate volume A; performing a scan of the same subject to generate volume B; comparing B to A to determine whether the condition is met; if the condition is not met, performing a scan of the same subject to generate volume C; comparing C to B to determine whether the condition is met; and so on. Experimental data has shown that even with capture of multiple test volumes, this reference process may be completed within less than a minute at a beginning of an MR scan, and in many cases 20 seconds or less.

Process 230 begins at block 232 where the slice analysis facility instructs the MRI system to acquire a first volume during an MRI scan, that will serve as a provisional volume in the process. In some embodiments, the provisional volume may be acquired by acquiring multiple contiguous slices. Techniques for acquiring a slice are described herein including at least with respect to block 202 of process 200.

After instructing the MRI system to acquire the provisional volume, process 230 proceeds to block 234, where the slice analysis facility instructs the MRI system to acquire a slice during the MRI scan. In some embodiments, the slice may be subsequently used to construct a second volume, which will serve as a current volume in the process. Techniques for acquiring a slice are described herein including at least with respect to block 202 of process 200.

At block 236, the slice analysis facility aligns the slice of the current volume to the provisional volume and, based on the results of the alignment, estimates the motion of the subject. In some embodiments, aligning the slice of the current volume to the provisional volume may include using the alignment techniques described herein including at least with respect to block 204 of process 200. In some embodiments, estimating the motion of the subject during the MRI scan includes using the motion estimation techniques described herein including at least with respect to block 206 of process 200.

At block 238, the slice analysis facility determines whether the slice is the last slice corresponding to a current volume. If the slice is not the last slice, then the process 230 returns to block 234, where the slice analysis facility instructs the MRI system to acquire the next slice for generating the current volume. If the slice is the last slice, then process 230 proceeds to block 240.

At block 240, the slice analysis facility determines whether the estimated motion of any of the slices of the current volume, as determined from block 236, exceeds a threshold. In some embodiments, this may include comparing whether a metric indicative of the estimated motion, such as a slice displacement (SD), exceeds the threshold. In some embodiments, the threshold may be zero, less than an eighth of the slice thickness, less than a fourth of the slice thickness, less than a third of the slice thickness, less than a half of the slice thickness, or any other suitable threshold, as aspects of the embodiments are not limited in this respect. For any of the slices of the current volume, if the estimated motion, or metric indicative of the estimated motion, exceeds the threshold, then process 230 returns to block 232 for acquiring a different provisional volume. In some embodiments, to acquire a different provisional volume, the current volume may be substituted for the provisional volume in the process. In other embodiments, another new volume may be acquired instead. If the estimated motion, or metric indicative of the estimated motion does not exceed the threshold for any of the slices, then the process 230 proceeds to block 242. This may indicate that there was little to no motion (e.g., motion below a threshold) of the subject during acquisition of both the provisional and current volumes. In some embodiments, this volume may then be identified as the reference volume.

At block 242, the slice analysis facility outputs the provisional volume as the reference volume. In some embodiments, the slice analysis may use the reference volume in conjunction with other processes, including process 200, described herein with respect to FIG. 2A.

Figure 2C:
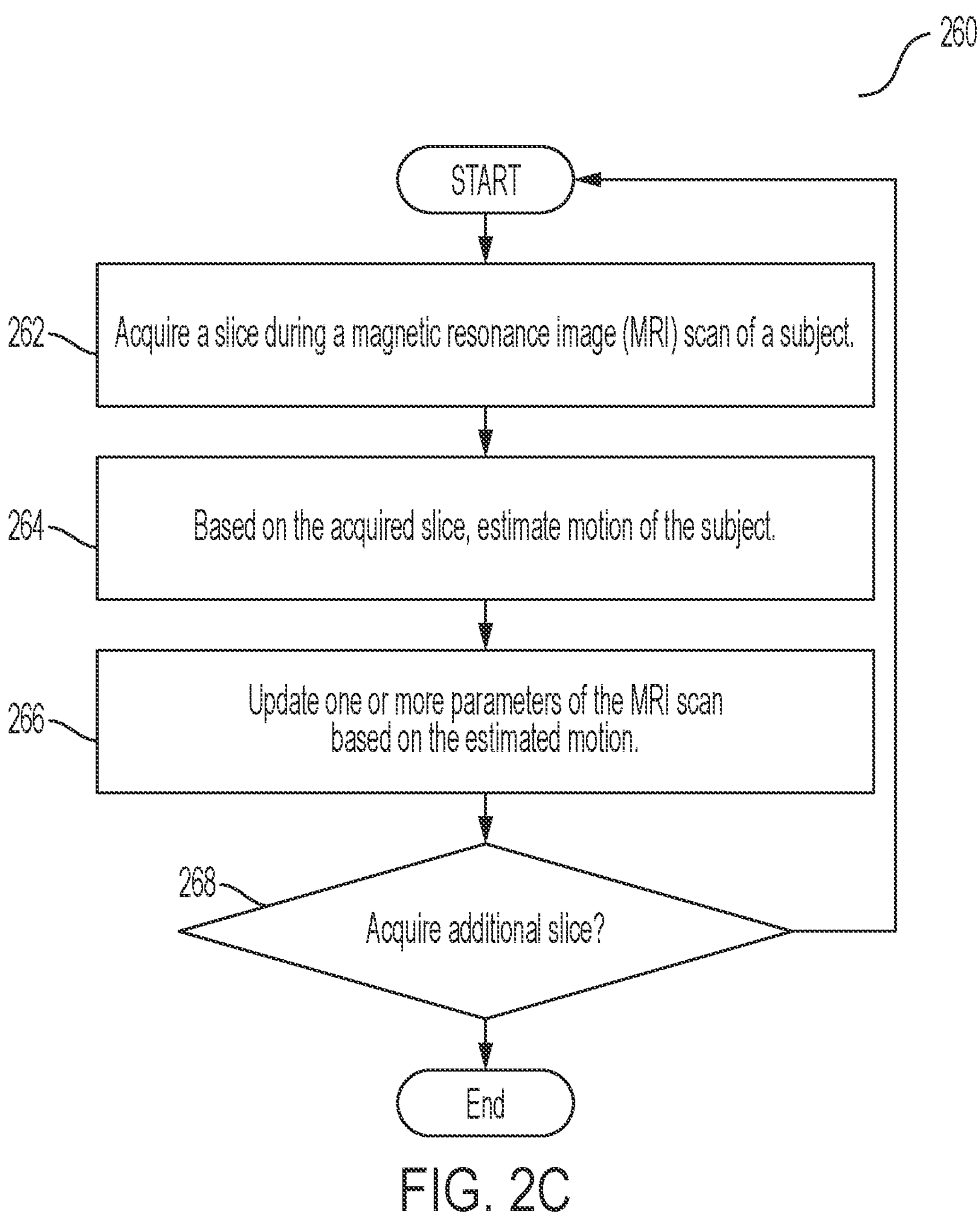
FIG. 2C is a flowchart of an illustrative process 260 for prospectively correcting for estimated motion of a subject during an MRI scan, in accordance with some embodiments of the technology described herein.

FIG. 2C is a flowchart of an illustrative process 260 for prospectively correcting for estimated motion of a subject during an MRI scan, in accordance with some embodiments of the technology described herein. Process 260 may be implemented by a slice analysis facility, such as the facility 122 of FIG. 1. As such, in some embodiments, the process 260 may be performed by a computing device configured to send instructions to an MRI system and/or to receive information from an MRI system (e.g., MRI system console 120 executing slice analysis facility 122 as described in connection with FIG. 1). As another example, in some embodiments, the process 260 may be performed by one or more devices/processors located remotely (e.g., as part of a cloud computing environment, as connected through a network) from the MRI system that obtained the input MR data.

Process 260 begins at block 262, where the slice analysis facility instructs the MRI system to acquire a slice during the MRI scan. Techniques for acquiring a slice are described herein including at least with respect to block 202 of process 200.

At block 264, the slice analysis facility estimates motion of the subject during the MRI scan based on the acquired slice. Techniques for estimating motion based on an acquired slice are described herein include with respect to process 200 of FIG. 2A. In some embodiments, the slice analysis facility may determine an updated position of the subject based on the estimated motion. For example, the output of block 264 may include updated coordinates of the subject within the scanner, a metric indicative of the estimated motion, and/or any other suitable data.

At block 266, the slice analysis facility may update one or more parameters of the MRI scan based on the motion estimated at block 264. In some embodiments, updating the one or more parameters of the MRI may include updating parameters of the MRI sequence used for acquiring data and conducting the MRI scan. For example, updating the parameters may include updating acquisition coordinates to compensate for the estimated motion and/or an updated position of the subject in the scanner. In some embodiments, the slice analysis facility may update the one or more parameters prior to acquiring a subsequent slice, such as the next consecutive slice, for example. While example techniques for updating MRI parameters to prospectively correct for the estimated motion have been described herein, it should be appreciated that any suitable techniques may be used, as aspects of the embodiments described herein are not limited in this respect.

At block 268, whether to instruct the MRI system to acquire an additional slice or slices. The slice analysis facility may determine that an additional slice should be acquired for multiple reasons. For example, the current slice may be one slice of multiple slices used to generate a volume. If the current slice is not the last slice, then an additional slice may be acquired. As another example, if the current slice or any previous slices are corrupt with motion, then an additional slice may be acquired to replace the corrupt data. If an additional slice or slices are to be acquired, then the process 260 returns to block 262 for acquiring a slice with the updated parameters. If an additional slice or slices are not to be acquired, then the process 260 ends.

Example Embodiments

Described below are certain non-limiting examples of acquiring a slice during an MRI scan, aligning the slice to a reference volume, and estimating motion based on the results of such an alignment. These are intended to be illustrative of various ways in which techniques described herein may operate. It should be appreciated that embodiments are not limited to operating in accordance with these examples.

Figure 3:
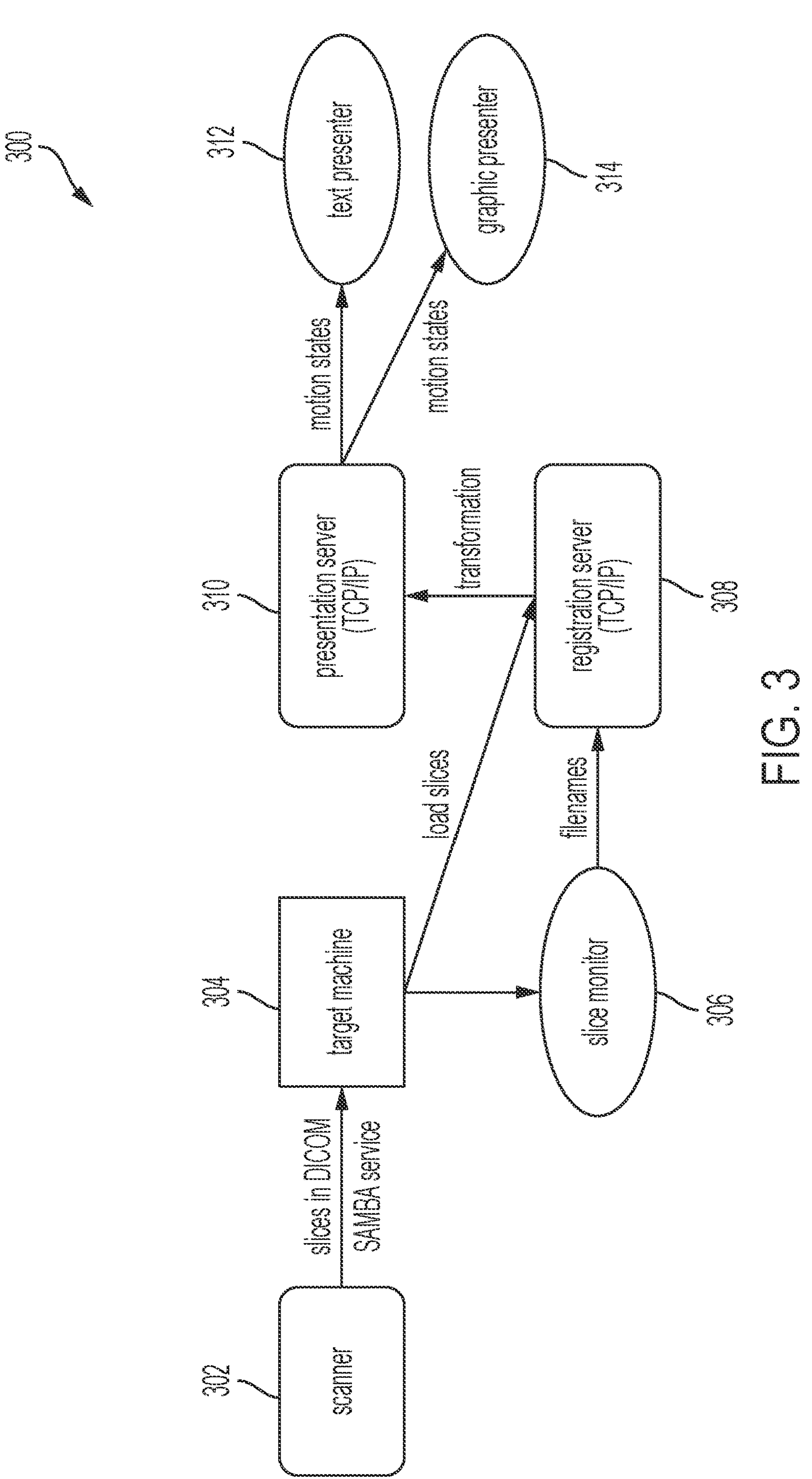
FIG. 3 is a block diagram showing an example system 300 for estimating motion, in accordance with some embodiments of the technology described herein.

FIG. 3 is a block diagram showing an example system 300 for estimating motion. The system 300 includes four components: an MRI scanner 302, a target machine 304, a slice monitoring module 306, a registration server 308, a presentation server 310, and client services 312, 314.

In some embodiments, slices may be acquired by the MRI scanner 302 and written to a file system. For example, an fMRI sequence may write the slices as they are acquired, in DICOM format, to a local file system or a network mapped file system mounted using the Server Message Block (SMB) protocol on the MRI scanner 302. In some embodiments, slices are transferred from a computer of the MRI scanner 302 to a workstation (e.g., slice analysis facility 122) that runs an algorithm for estimating motion of a subject during the MRI scan. For example, the slices may be transferred to target machine 304. In some embodiments, the slice monitoring module 306 watches the slice acquisition at a target machine 304 of the workstation and sends file names of the new slices to the registration server 308. In some embodiments, motion measurements may then be conducted by the registration service, dispatched to the presentation server 310, and shown by one or more client servers 312, 314. For example, the motion measurements may be dispatched asynchronously to one or more receiving clients 312, 314. The clients may present the motion trajectory through a graphic display, or as a text stream, or may be used to modify the visual or audio stimulus presented to the subject.

Example Algorithm

Figure 4:
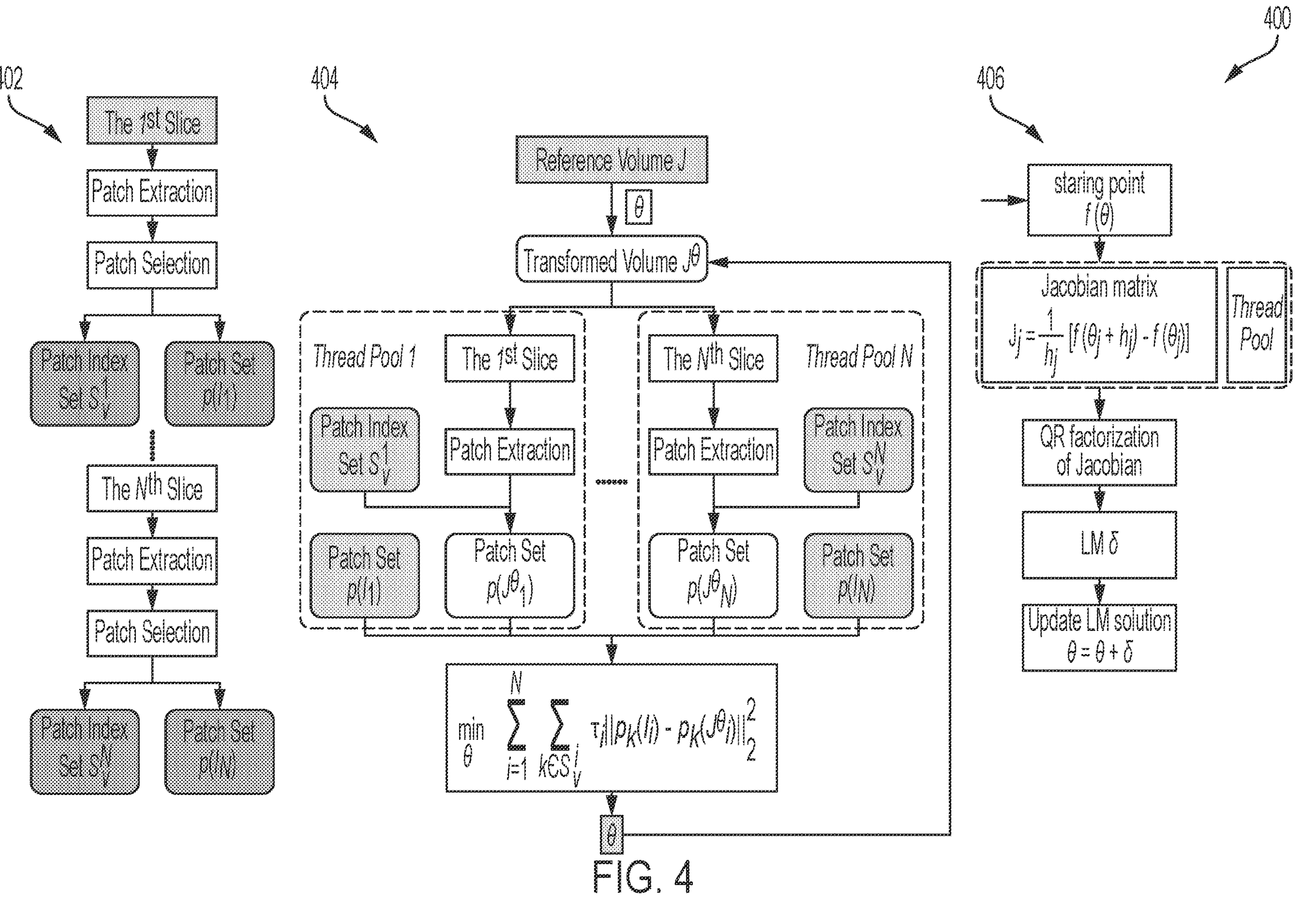
FIG. 4 is a flowchart describing an example slice-to-volume registration (SVR) algorithm 400, in accordance with some embodiments of the technology described herein.

Provided herein are example techniques for aligning a slice to a reference volume, which may also be referred to herein as slice-to-volume registration (SVR). In some embodiments, SVR may be conducted by a slice analysis facility (e.g., slice analysis facility 122). FIG. 4 is a flowchart describing an example SVR algorithm 400. The SVR algorithm 400 may include the following sub-processes: patch extraction selection processes 402, the slice-to-volume registration process 404, and iterative optimization 406. The SVR algorithm 400 and subprocesses 402, 404, and 406 are described herein in more detail.

In SVR, a reference 3D volumetric image may be transformed in 3D space to align to an input 2D slice image. Therefore, in some embodiments, given a 2D slice image and a 3D volumetric image, SVR can be formulated by a minimization problem:

$$\theta^* = \underset{\theta}{\operatorname{argmin}} f(I, T_n(J;\theta)) + \lambda r(\theta) \quad \text{Equation 1}$$

where the function $f(\cdot,\cdot)$ serves as a matching criterion that measures the similarity between the reference and source images; $T_n(\cdot;\theta)$ transforms the input volumetric image to the space of the slice image that has the motion state $\theta$ and then outputs the n-th oblique slice; $r(\theta)$ defines a regularization term (i.e., prior knowledge on $\theta$) that constrains the transformation; and $\lambda>0$ is a weight parameter balancing the cost between the similarity and the regularization terms. The solution $\theta^*$ represents the spatial transformation between the slice and the volume in a common space.

When a subject is deliberately and carefully holding still, there are still several physiological sources of motion or apparent motion. For example, these can include small magnitude displacements such as pulsation due to the cardiac cycle, and motion induced at the head due to breathing, together with dynamic modulations of the static field induced by respiration and motion of other body parts that induce phase encoding artifacts that disrupt spatial coding. There may also be referred motion at the head associated with moving the legs or arms. The head often moves if a subject swallows. Thus, even in the absence of overt movement, there are a number of sources of motion or apparent motion that may be characterized by nonrigid motion. Typically, no motion monitoring is carried out for these types of motion, and retrospective motion correction may be used to correct for cardiac and respiratory related effects.

In addition to these physiological sources, subjects may displace their head in a rigid body fashion, undergoing certain types of rotation and translation. In some embodiments, it is this rigid body motion imposed on top of smaller magnitude physiological motion sources, that is sought to be measured by volume-to-volume monitoring and retrospective correction. Similarly, the SVR techniques described herein may be used to monitor the rigid body motion that may displace the position of each source.

Head motion may therefore be modeled as a rigid body transformation. For example, in the SVR algorithm, head motion may be modelled as a rigid body transformation with 6 degrees of freedom in 3D space, with the parameters $\theta=[\alpha, \beta, \gamma, t_x, t_y, t_z]^T$ that represent the motion state of the subject head in the MRI scanner (world) coordinate system; where $\alpha$, $\beta$, and $\gamma$ denote the rotation angles about the axes—x, y, and z, and $t_x$, $t_y$, and $t_z$ denote the translations along the axes—x, y, and z, respectively. In neuroimaging, padding and soft restraints may be put around the subject's head in head coils to restrict motion and protect the head in particular for children and infants. Since this may limit the range of subject motion, the rigid-body assumption may be sufficiently expressive to represent subject motion, considering that the interaction effects of field in-homogeneities and geometric distortions present but yield second order. In motion measurement, the motion state $\theta_t$ of slice $I_t$ acquired at time t may be computed by registering slice $I_t$ to the reference volume (with a prior motion state $\theta_0$). The absolute motion of the slice $I_t$ against the reference volume may thus be computed, in some embodiments, as $\Delta\theta_t=\theta_t-\theta_0$. Correspondingly, head movement at the tth slice may be measured by $\Delta\theta_t-\Delta\theta_{t-1}$.

In some embodiments, matching criterion, also known as the similarity metric, may quantify how well (e.g., how accurately) a slice is registered to the reference volume. The choices of the matching criterion may depend on the nature of the problem. For the matching criterion in image registration, two approaches are mainly adopted: iconic and geometric. Iconic criteria employ voxel intensities to quantify the similarity, whereas geometric criteria exploit the correspondences between anatomical locations or salient image regions. However, it should be appreciated that any suitable approach may be adopted, as aspects of the technology described herein are not limited in this respect.

In some embodiments, as shown in Equation 1, the similarity between the slice and the reference volume may be computed from the similarity between the slice and a second slice formed from a plane of the volume according to θ (position and orientation). With the input slice I and the extracted slice I', the similarity $f(\cdot,\cdot)$ can be evaluated. For the purpose of this example, matching criterion may be based on the Euclidean distance between local image patches. There are advantages to be gained from this matching criterion when minimizing $f(\cdot,\cdot)$ in the registration: first, it poses a nonlinear, unconstrained least squares problem that can be solved by gradient descent-based algorithms scaled by parallel computing techniques; and second, it can be easily extended to other metrics, e.g., the global normalized correlation metric by zeroing the means and rescaling the two slices to unit $\ell^2$-norm, respectively.

In some embodiments, the gradient descent-based algorithms that find transformation parameters by maximizing the matching criterion, may benefit from data being independent and identically distributed (i.i.d), because 1) if the data samples are strongly correlated to each other, the gradient used to update the objective may be dominated by only a few representative samples (e.g., centers of the clusters); and 2) if the data samples are from different distributions, they may compete against each other when computing the gradient and may weaken the gradient magnitude. These can lead to slow convergence or convergence to local optima. It may, however, in some embodiments, be unreasonable to assume that pixel intensities of the slices are i.i.d, because of their strong correlations to their neighboring pixels. In contrast, densely sampled local image patches may be considered to be i.i.d based on the inherent structures that have been demonstrated to exist in MR images, and also in natural images. This is known as the local self-similarity in MR images, and as the local structure in natural images. Thus, the matching criterion may be defined, in some embodiments, based on distances of local image patches sampled from the moving and target image slices:

$$f(I, I') = \sum_{k\in S}\|p_k(I) - p_k(I')\|_2^2, \quad \text{Equation 2}$$

where the patch extractor operation $p(\cdot)$ densely samples, with overlap, the local image patches from input slice. Those patches may be indexed by the set S. Since the densely sampled local patches may reside on a low-dimensional subspace or manifold due to their strong local correlations, they may be approximated by samples drawn from an independent and identical multivariate Gaussian distribution. An example patch extraction process is shown in subprocess 402 of the SVR algorithm 400.

Certain slice images may, in some embodiments, contain a large number of homogeneous patches, e.g., patches from the background. Using such patches that have many correspondences in the volume may add to the computational requirement while not facilitating convergence to the minima of the alignment criterion. In some embodiments, a patch selection scheme may be exploited to select patches that contain pixels from regions with rich features that may help improve the matching process. In this scheme, patches may be selected based on their pixel variance. For example, only patches with top pixel variance (e.g., 55%, 60%, 65%, etc.) may be incorporated into the matching criterion. Equation 2, therefore, may be rewritten, in some embodiments, as:

$$f(I, I') = \sum_{k\in S_v}\|p_k(I) - p_k(I')\|_2^2, \quad \text{Equation 3}$$

where the set $S_v \subset S$ indexes the patches from the input slice I with the top greatest pixel variances. Therefore, this patch selection criterion may identify patches that drive the alignment and reduce the computational cost of the matching criterion. An example patch selection process is shown in subprocess 402 of the SVR algorithm 400.

In some embodiments, the ease with which the alignment of a slice with a reference volume can be computed may depend on the amount of brain tissue visible in the slice. In some embodiments, slices at the top and bottom of the brain may have good matches in several positions due to the reduced amount of brain tissue visible in those slices, whereas slices in the middle of the brain may more frequently have a unique good match. Consequently, it may be advantageous to consider more than one slice at a time in computing the alignment. Simultaneous multi-slice (SMS) acquisitions reconstruct two or more maximally separated slices at the same time and may be useful for conducting an alignment. In some embodiments, slices may be acquired in an interleaved order that may be used to improve alignment by computing the alignment using two or more slices that are consecutively acquired in time, rather than using slices that are physically adjacent to each other. Limited features in border slices may lead to misalignment and errors in SVR, in some embodiments. As a result, alignment of a single slice may be more challenging than alignment of two or more slices that cover the anatomy at different locations. In some embodiments, EPI slices in fMRI may be acquired in an interleaved manner, primarily to avoid cross-talk between slices, with the number of slices skipped referred to as the interleaving parameter. In some embodiments, this may strengthen feature matching in SVR; and may make SVR robust especially at border slices.

In an SMS acquisition scheme, patches taken from N simultaneously acquired slices may sample the anatomy at positions that are at $$\frac{1}{N}$$

distances of each other, where FOVs is the field-of-view in the slice select direction (i.e., the number of slices times slice thickness). The N slices that are acquired at the same time, have the same motion state; therefore, they can regularize SVR and may improve its accuracy. In some embodiments, the simultaneous-N-slice-based similarity minimization may thus be written as:

$$\min_{\theta}\sum_{i=1}^{N}\sum_{k\epsilon S_v^i}\tau_i\left\|p_k(I_i)-p_k\left(T_{n_i}(J;\theta)\right)\right\|_{2'}^2 \quad \text{Equation 4}$$

where the subscript $n_i$ denotes the index of the i-th slice from the volume, and $$\{S_v^i\}_{i=1:N}$$

indexes patches that are selected from the i-th input slice. A linear interpolator may be employed in the transformer $T_n(\cdot;\cdot)$ to make a trade-off between accuracy and computational efficiency. N weight parameters $\tau_{1:N}$ may be used to balance between the N similarity terms related to the N simultaneous slices. As a result, more flexible strategies can be applied, in some embodiments, to fine tune the stability and accuracy of the registration by setting different values of $\tau_i$ for different input slices. For example, the value of $\tau_i$ can be chosen dynamically based on the area covered by the slice $I_i$, approximated by pixel intensities, i.e., if a slice contains more features, $\tau_i$ may be set to a larger value:

$$\tau_i=\frac{\tau_i'}{\sum_i\tau_i'},\ \tau_i=\exp\left(\frac{1}{\sigma}\sum_k|I_i(k)|\right) \quad \text{Equation 5}$$

where $\sigma>0$ is a scale parameter for the exponential function. In some embodiments, the $\tau_i$ value could also be set manually according to empirical knowledge. In the particular case of single slice acquisition, when $\tau_{2:N}=0$, Equation 4 leads to the ordinary SVR problem. In some embodiments, these techniques may be implemented as part of the subprocess 404 of the SVR algorithm 400.

In some embodiments, Equation 4 may be solved by a single-valued optimizer or a multi-valued optimizer such as the Levenberg-Marquardt (LM) algorithm, for example. For the purpose of this example, the LM algorithm was chosen for its faster convergence, as shown at subprocess 406 of FIG. 4. Equation 4 poses a standard nonlinear unconstrained least squares problem with respect to the motion states θ, where the set of $$\sum_{i=1}^{N}|S_v^i|$$

datum pairs may be described as:

$$\bigcup_{i=1}^{N}\{(f_k^i(\theta),\ 0)|k\in S_v^i\} \quad \text{Equation 6}$$

where $$f_k^i(\theta)$$

is written as $$f_k^i(\theta)=\tau_i\left\|p_k(I_i)-p_k\left(T_{n_i}(J;\theta)\right)\right\|_{2'}^2 \quad \text{Equation 7}$$

The LM algorithm may involve iterations of this form:

$$\theta^{t+1}=\theta^t+\delta^t \quad \text{Equation 8}$$

where $\delta^t$ indicates the search direction and the step size that may reduce (e.g., maximally) the objective function (i.e., the similarity function in Equation 4) at the t-th iteration.

In some embodiments, according to the first-order Taylor series expansion, the similarity at the (t+1)th iteration may be approximated by $$f_k^i(\theta^{t+1})=f_k^i(\theta^t+\delta^t)\approx f_k^i(\theta^t)+\frac{\partial f_k^i(\theta^t)}{\partial\theta^t}\delta_k^t \quad \text{Equation 9}$$

In some embodiments, it may be derived in the LM algorithm that $\delta^t$ can be solved analytically from the following closed-form solution:

$$\delta^t=\left(J^TJ+\lambda\text{diag}(J^TJ)\right)^{-1}J^Tf(\theta^t) \quad \text{Equation 10}$$

where all the $$f_k^i(\theta^t)$$

values with respect to $\theta^t$ are combined into a vector $f(\theta^t)$ $\mathbf{J}\in\mathbb{R}^{M\times 6}$ denotes the Jacobian matrix of $f(\theta^t)$ for $$M=\sum_{i=1}^{N}|S_v^i|;$$

diag($\mathbf{J}^T\mathbf{J}$) denotes the diagonal matrix consisting of the diagonal elements of $\mathbf{J}^T\mathbf{J}$; and λ is a weight parameter.

In some embodiments, the iterative LM algorithm may begin with an initial guess for the solution, i.e., $\theta^0$, which may impact the final solution. The solution $\theta^0$ may be initialized for slice $I_i$ by the motion state of the slice acquired prior to it. In some embodiments, the algorithm may stop if any of the following criteria is reached: 1) both the actual and predicted relative reductions in the sum of squares are at most a threshold value (e.g., $10^{-8}$); 2) the relative error between two consecutive iterations is at most a threshold value (e.g., $10^{-8}$); and 3) the cosine of the angle between the functions evaluated at $\theta^t$ and any column of the Jacobian is at most a threshold value (e.g., $10^{-5}$ in absolute value).

The solution to $\text{dnew}^t$ shown in Equation 10 may, in some embodiments, involve a Jacobian matrix, matrix multiplications, and a matrix inversion. Although the matrix inversion has a cubic order ($\vartheta(n^3)$) of computational complexity, the matrix being inverted is of size 6×6. The matrix multiplications may be performed efficiently by applying a QR decomposition on the Jacobian matrix J. The Jacobian matrix has M×6 elements to be computed. The computational cost of computing J may increase linearly with a factor 6 with the number of patches in Equation 4. As a result, computing the Jacobian matrix J is the main computational burden in Equation 10, in particular over a large number of empirical datum pairs such as image data. Experiments have been performed to estimate example execution times for different steps. In particular, in the experiment, the LM algorithm took 60% execution time in computing the Jacobian matrix, 21% for QR decomposition, and 19% for the remaining steps. Thus, described herein are techniques for speeding up the Jacobian matrix computation for the LM algorithm.

In some embodiments, a finite difference method may be used to compute the Jacobian matrix. The forward difference for the Jacobian may be written as:

$$\mathbf{J}=[\mathbf{J}^1, \ldots, \mathbf{J}^N]^T \quad \text{Equation 11}$$

where the sub-matrices may be found by:

$$J_{kj}^i = \frac{1}{h_j}\left(f_k^i(\theta_j + h_j) - f_k^i(\theta_j)\right) \quad \text{Equation 12}$$

with I=1, 2, . . . , N, j=1, 2, . . . 6, and $h_j>0$ being the step length of the forward difference obtained from:

$$h_j = \max\left(\sqrt{\max(10^{-11}, \epsilon)},\ \sqrt{\max(10^{-11}, \epsilon)} \cdot |\theta_j|\right) \quad \text{Equation 13}$$

where $\epsilon$ denotes the machine precision.

In some embodiments, the N sub-matrices $J^i$ can be computed independently over the simultaneous-N-slice by using N sets of threads, leading to N times acceleration. For a sub-matrix $J^i$, the function values $$f_k^i(\theta_j + h_j)$$

may only depend on $\theta_j$. Hence, in some embodiments, another 6 threads may be employed to compute the 6 columns of $J^i$ in parallel, resulting in an additional 6 times acceleration for the Jacobian matrix computation.

In summary, in some embodiments, an SVR algorithm can be accelerated for performance during an MRI scan by optimizing the matching criterion and parallelizing the optimization algorithm. The patch-based matching criterion may lead to fewer iterations to enable the optimization algorithm to rapidly converge. The patch selection scheme may identify a top percentage (e.g., 55%, 60%, 65%, etc.) of patches for the similarity evaluations, which constitutes a saving of a percentage (e.g., 35%, 40%, 35%, etc.) of computational costs. Further, the multi-threaded LM algorithm may speed up the Jacobian matrix computation by 6N× by the parallelization design.

Example Techniques for Calibrating a Reference Volume

Some embodiments described herein provide for techniques for calibrating a reference volume (e.g., illustrative process 230 of FIG. 2B). In some embodiments, when the motion monitoring system is launched with an MRI scan (e.g., fMRI or diffusion-weighted MRI) scan, it may start with an auto-calibration stage that uses an SVR algorithm to find a reference volume. For example, the SVR algorithm may include the techniques described herein including with respect to FIGS. 2A-B and FIG. 4. In some embodiments, the auto-calibration stage works as follows: the first volume may be regarded as a provisional reference volume. The slices of a second volume (e.g., a current volume) may then be registered to this volume using SVR as they are acquired. In some embodiments, the motion measurements may be compared to a predefined threshold. If the motion measurements on the slices (e.g., some, most, or all of the slices) of the second volume are below a predefined threshold, the first volume may be confirmed as the reference volume as this indicates no motion above the threshold was detected within the slices of the first and second volume. In some embodiments, if the motion measurements do not pass the threshold condition, the first volume may be discarded, the second volume may be regarded as the provisional reference, and slices of a third volume may be registered to the second volume. The motion measurements between the second and third volumes may then be evaluated and compared against the threshold. In some embodiments, this process may continue until no motion above the threshold is detected within the slices of two consecutive volumes, which means that the first volume of the two may be chosen and used as the motion-free reference for SVR techniques described herein.

Example Experiments

Experiments were undertaken to investigate the ability of some of the techniques described herein to estimate motion of a subject during an fMRI scan. The motion estimation techniques were referred to in the experiments as Slice Localization Integrated MRI Monitoring (SLIMM) and may be referred to as SLIMM herein.

To assess SLIMM, extensive real fMRI data was acquired with real, in-scanner motion. All the prospective imaging experiments for this study were done on 3 T Siemens MR scanners (Siemens Healthcare, Erlangen, Germany). All scans were performed in accordance with a protocol approved by the institutional review board committee. Some parameters of the fMRI sequences used in this study are shown in Table 1, and the data sets are described below. Besides that, all scans used the parameters: pixel bandwidth of 2230 Hz/pixel, field of view of 192 mm×192 mm×108 mm, in-plane acceleration factor of 2, and flip angle of 90 degrees. Conventional fMRI sequences of ascending order use the slice order of [1:1:n] in the directions from foot to head with n being the number of slices per volume, and i:j:k denoting a number sequence from i to k by a step j. The experimental fMRI acquisitions used the interleaved scheme, where an even-first ascending order was incorporated. An interleave factor of $n_i$ in the fMRI sequences means that the slice order is [2:$n_i$:n, 1:$n_i$:n−1]. Moreover, SMS was accomplished in combination of the interleaved scheme. An SMS factor of $n_{SMS}$ in the fMRI acquisitions means that $n_{SMS}$ slices are simultaneously acquired and the slice order of these $n_{SMS}$ slices is (i, i+$j_1$, . . . , i+$j_{n_{SMS-1}}$) with $$j_k = k \cdot \frac{n}{n_{SMS}}$$

and $i \in 1, \ldots, n$. For example, with an SMS factor of 2, an interleave factor of 2, and number of slices n=36, the slice order is (2, 20), (4, 22), (6, 24), . . . , (18, 36), (1, 19), (3, 21), (5, 23), . . . , (17, 35), where $(i_1, i_2)$ indicates slices $i_1$ and $i_2$ are simultaneously acquired.

TABLE 1

Description of the fMRI time series obtained using 2D gradient-echo EPI sequences on different data sets.

| Data Set | # Measurements | Interleave Factor | SMS Factor | TR/TE (ms) | Slice Thickness (mm) | # Slices | Matrix Size |
|---|---|---|---|---|---|---|---|
| EM-Tracking | 96 | 2 | 2 | 1500/30 | 3 | 36 | 64 × 64 |
| Optical Motion Tracking | 180 | 2 | 2 | 1500/30 | 3 | 36 | 64 × 64 |
| Subject | 160/96 | 2 | 2 | 1500/30 | 3 | 36 | 64 × 64 |

Electromagnetic Sensor Motion-Tracking Data Set (EM-Tracking). To assess the accuracy of this approach in motion measurement with real in-scanner motion, gold standard motion measurements were constructed as the reference motion points and motion-free reference data was acquired. fMRI scans were conducted in 6 volunteer subjects with real, in-scanner motion. For each volunteer, two fMRI time series were acquired: in one scan the volunteer stayed still, and the acquired scan was used as the "no motion" reference. During the other scan the volunteer was instructed to move via audio cues. An electromagnetic (EM) motion tracking sensor was used to monitor motion during scans. Motion measurements from the EM tracker were used as the reference.

Optical Motion Tracking Data Set. Gold standard motion measurements from various motion sensors were used to thoroughly assess the accuracy of the motion measurement approach. In particular, an optical motion tracking system was employed to establish the gold standard measurements. For one volunteer subject, two head motion tracking data sequences were recorded using the Kineticor camera system during fMRI scans in which the volunteer performed real, in-scanner motion. During the scan, the volunteer was instructed to perform nodding head motion. The measurements obtained from the Kineticor optical motion tracking system were used as reference motion points for this data set.

Subject Data Set. Beyond the volunteers' scans where the volunteers were instructed to move, this approach was assessed in the real, unconstrained acquisitions. Therefore, this data set was acquired from 3 subjects with real, in-scanner motion, containing 2 resting-state fMRI scans and a task-based fMRI scan (finger tapping). For these scans the subjects were encouraged to stay still, but they moved.

Healthy Brain Network (HBN) Data Set. To evaluate the efficacy of the auto-calibration module on large real pediatric data, the HBN data set, which contains resting state fMRI scans of 251 subjects, was used. The age range of these subjects is from 5.8 to 21.4 years. The fMRI time series have 375 measurements, slice thickness of 2.4 mm, number of slices=60, and matrix size=84×84.

The algorithms were implemented in C++. All experiments reported in this work were conducted on a workstation with 20 cores of Intel® Xeon® CPU E5-2698 v4 @2.20 GHz.

Since volume-to-volume registration (VVR) methods have been popular and used in the past, the techniques were compared to a VVR method. The VVR method (VVR-LM) was implemented with a mean squares metric obtained from Numpy, a linear interpolator provided by SimpleITK for resampling image, and an LM optimizer implemented by Scipy. The rigid transform was implemented by 3 Euler angles and 3 translations and initialized by the transform estimate of the prior volume. VVR-LM is able to perform in real-time, and thus it enables motion monitoring. As a result, it was designed with different aims from those retrospective VVR methods, such as SPM and FSL/FLIRT. VVR-LM implemented in this work aims at measuring motion in real-time, while those retrospective VVR methods target more complicated registration designs, e.g., performing both intra- and inter-modality registrations, and removing motion artifacts from the images.

VVR-LM was used to compare the performance of using SLIMM in comparison to using the VVR strategy.

The assessments of this approach focused on the accuracy and actual speed of motion measurement, and acquisition efficiency and quality. The techniques were not compared to alternative approaches that were too slow to complete the motion monitoring before the next slice was acquired.

In order to accurately detect the volumes during which motion has occurred, it is important that the motion measurement be accurate. In order to accurately identify sections of data that are corrupted by motion, for which additional data will be acquired, accurate estimation of the motion of each slice is important. In addition, the motion measurement should not wrongly indicate that there is motion when the subject is holding still. Extensive experiments were thus conducted to assess the accuracy of the motion measurements.

The accuracy of the motion measurement was assessed through two types of criteria:

Motion measurement error. The motion measurement error was calculated and reported in terms of both motion transformation parameters and slice displacement (SD) on the data sets where reference motion parameters are available.

tSNR from the retrospective correction. Temporal signal-to-noise ratio (tSNR) is an important metric to assess the fMRI data quality. The calculation of tSNR is required to run on the motion-corrected data. Therefore, the accuracy of the motion measurement is highest when the tSNR is highest, because the tSNR is reduced by increased signal variance when the alignment is wrong.

Accuracy through Motion Measurement Error. Two real motion data sets were acquired along with gold standard motion measurements. The errors in motion parameters and SD can be investigated on these data sets to assess the accuracy of the approach in motion measurement by referring to the gold standard motion measurements. The motion parameter error $e_p(k)$ at the kth slice in an fMRI data sequence was obtained from $$e_p(k) = |p_{ref}(k) - p_m(k)| \quad \text{Equation 14}$$

where $p_{ref}$ and $p_m$ respectively denote the motion transformation parameters, consisting of 3 rotational and 3 translational parameters, obtained from the reference and the image alignment-based motion measurement method (SLIMM or VVR-LM in the experiments), and $|\cdot|$ was applied for elementwise absolute value.

Similarly, the SD error $e_d(k)$ at the kth slice in an fMRI data sequence was computed from $$e_d(k) = |d_{ref}(k) - d_m(k)| \quad \text{Equation 15}$$

where $d_{ref}$ and $d_m$ respectively denote the SD obtained from the reference and the motion measurement method by using approach that is used to compute frame displacement.

Frame displacement (FD) assessment was first proposed in order to characterize the amount of head motion, and FD was used to demonstrate that widely used retrospective motion correction strategies do not eliminate the influence of motion on the BOLD signal. In past studies, each volume i of an fMRI time series was aligned to a reference volume, providing a rigid body transformation $T_i$. FD was defined as:

$$FD_i = |\Delta\alpha^i| + |\Delta\beta^i| + |\Delta\gamma^i| + |\Delta t_x^i| + |\Delta t_y^i| + |\Delta t_z^i|, \text{ where } \Delta t_x^i = t_x^{(i-1)} - t_x^i,$$

and similarly for the other rigid body parameters $$[\alpha^i, \beta^i, \gamma^i, t_x^i, t_y^i, t_z^i].$$

Rotation parameters were converted from degrees to millimeters by computing the arc length subtended by the angle on the surface of a sphere of radius 50 mm. This radius is approximately the average distance from the center of the head to the cortex. Different numerical values could be used for different sized heads.

In some embodiments, the FD may be generalized to slices by considering the possibility that each slice, not just each volume, may undergo an independent rigid body transformation. In this case, for a slice j of volume i, the SD may be denoted:

$$SD_{ji} = |\Delta\alpha^{ji}| + |\Delta\beta^{ji}| + |\Delta\gamma^{ji}| + |\Delta t_x^{ji}| + |\Delta t_y^{ji}| + |\Delta t_z^{ji}|,$$

where the differences in displacement are computed similarly to that of the volumes.

The reference motion parameters (e.g., gold standard measurements) were available on the EM-Tracking and the optical motion tracking data sets. SLIMM and VVR-LM were run separately to measure the motion at the slice and the volume level, respectively, on the two data sets. Thus, it was possible to evaluate the motion parameter error and the SD error. Since VVR-LM measured the motion at the volume level, motion measurements were generated at the slice level for VVR-LM by assigning the measurements of each volume to its all slices. The goal in this experiment was to validate SLIMM performed with smaller errors than VVR-LM in terms of both above criteria, indicating SLIMM performed more accurately than VVR-LM in motion measurement.

Accuracy through retrospective correction. As addressed above, tSNR is an important metric to assess the fMRI data quality. However, the calculation of tSNR was required to run on the motion-corrected data. Thus, the volumes were corrected by reconstructing volumes from individually registered slices. For this, a slice acquisition model was used as a slice-based motion correction technique, to reconstruct time series of fMRI volumes from motion-corrected slices. Let x be the vector form of the reconstructed volume, and $y_i$ the vector form of the i-th acquired slice $I_i$. The slice acquisition model is written as:

$$y_i = P_i S_i T_i x + \mu_i \quad \text{Equation 16}$$

where $T_i$ transforms x according to $\theta_i$ ($T_i$ defines the inverse transform according to $\theta_i$); $S_i$ denotes the slice profile which is approximated here by a truncated Gaussian for the 2D gradient-echo EPI for fMRI; $P_i$ extracts the ith slice from the volume; and $\mu_i$ denotes an additive noise term. Assuming that the noise $\mu_i$ yields a zero-mean Gaussian distribution, the motion-free volume x can be reconstructed from:

$$\min_x \sum_i \|y_i - P_i S_i T_i x\|_2^2 + \lambda\|\nabla x\|_1 \quad \text{Equation 17}$$

The first term is least squares, and the second term is total variation regularization weighted by $\lambda>0$; where $\nabla$ denotes the derivative operation. Equation 17 is solved by gradient descent, where the update for x at the kth iteration is found by:

$$x^{(k)} = x^{(k-1)} - \eta\left(g\left(x^{(k-1)}\right) + \lambda\left(x^{(k-1)}\right)\right) \quad \text{Equation 18}$$

with the derivatives of the data fidelity term $g(\cdot)$ and the regularization term $r(\cdot)$ defined by $$g(x) = \sum_i T_i^T S_i^T P_i^T \left(P_i^T S_i^T T_i^T x - y_i\right) \quad \text{Equation 19}$$

$$r(x) = \left(1 - \nabla^{-1}\right)\text{sign}(\nabla x)$$

where $$T_i^T$$

denotes the inverse transform of $T_i$ (corresponding to $\theta_i$);

$$S_i^T$$

denotes the convolution kernel with flip of $S_i$ from left to right, top to bottom;

$$P_i^T$$

performs zero-slice padding for the ith slice; I denotes the identity matrix; $\nabla^{-1}$ computes the backward derivative; and the operator sign(·) computes the sign of its input. In Equation 18, the learning rate was set to $\eta=0.1$, and the regularization weight $\lambda=0.1$. Note that the slices $y_i$ may move out-of-plane after performing the SVR, leading to artifacts in reconstruction. Total variation regularization, therefore, may enhance the reconstruction by edge-preserving smoothing.

The performance gained from the SLIMM approach was analyzed in terms of tSNR. In the experiments, the data was retrospectively corrected with motion at the slice and volume level, through the motion measurements obtained from SLIMM and VVR-LM, respectively. It was then possible to compute the tSNR over these motion-corrected data for the comparisons. In addition, on the EM-Tracking data set, the reference scans containing the data with no motion (from the "no motion" reference scans during which the volunteers were asked to hold still) were available and adopted as the references for the comparisons in tSNR. In those comparisons, frame censoring was also incorporated to investigate the tSNRs and their respective changes. When frame censoring was turned off, all 96 corrected volumes of each subject were used to compute the tSNRs. When frame censoring was enabled, motion-corrupted volumes were excluded and tSNRs were computed over the remaining corrected volumes. A method was used to identify motion-corrupted volumes, where motion measurements of each slice were compared against a threshold (e.g., $\frac{1}{8}^{th}$, $\frac{1}{4}^{th}$, $\frac{1}{3}^{rd}$, ½ of slice thickness). A volume was removed if it had greater than or equal to one motion-corrupted slices.

In some embodiments, a goal of the motion monitoring approach, SLIMM, may be to reduce the scan duration and to improve the data quality through the online frame censoring and real-time feedback to the subject as well as the scanner operator. The online frame censoring enabled adjusting the length of acquisition dynamically and adaptively. It collected the motion-free volumes only, which were identified through the real-time slice-by-slice motion measurements, and automatically increased the length of acquisition until sufficient motion-free volumes have been collected. SLIMM also provided real-time feedback during the scan, which has been demonstrated to be effective to reduce scan duration.

Motion Identification. Both the online frame censoring and the real-time feedback relies on the motion identification incorporated in the motion monitoring system. In SLIM, the motion was identified from the motion measurements by thresholding the SD according to a predefined motion threshold parameter. If a slice was measured to displace over the motion threshold, then it was identified as a motion-corrupted slice. If a volume contained any motion-corrupted slices, then this volume was identified as a motion-corrupted volume and was excluded from the data collection with the online frame censoring protocol.

As presented above, the motion threshold may be important to motion identification. Described herein are example threshold values for SLIMM. In the VVR-based method, the motion threshold from the range of [0.2, 0.6] is widely used on frame displacements (FD) that are computed volume by volume, from high to low. In the assessments of SLIM, the motion threshold was imposed on SDs computed slice by slice. Therefore, the motion identified through the SDs was verified to determine whether it was consistent with the FDs for the same volumes, i.e., were all the SDs of those volumes less than $t_{FD}$ as well when the FDs of those volumes were less than $t_{FD}$, for a motion threshold $t_{FD}\in[0.2, 0.6]$? In this experiment, on the EM-Tracking data set where the gold standard motion measurements were available, the volumes with the FDs<$t_{FD}$ were collected according to the measurements of VVR-LM. The SDs of the same volumes were calculated over the gold standard motion measurements, and then constructed distributions of these SDs to analyze the results. If the SDs were consistent with the FDs, the same threshold values in [0.2, 0.6] could be directly used for SLIMM; otherwise, the appropriate threshold values corresponding to those on the FDs in this range would be found.

In the latter case (not consistent), the FD measured by using VVR-LM was first computed, and all the fMRI data volumes of FD≥$t_{FD}$ were found out, as the motion-corrupted volumes, for a motion threshold $t_{FD}\in[0.2, 0.6]$, on the EM-Tracking data set where the gold standard motion measurements were available. Since VVR-LM may identify by mistake these motion-corrupted volumes from the less accurate FDs, 20% of these volumes that led to the top 20% largest differences in SD between the measurements of gold standard and VVR-LM were excluded, to form a set of motion-corrupted volumes.

SLIMM should identify all the volumes in this set as motion-corrupted. To this end, a motion threshold t was identified that should be less than or equal to all the maximum SDs of each volume in this set, to ensure that at least one slice of each volume was motion-corrupted. The threshold t was thus found by:

$$t=\min\{\max\{D\}_j\}_{j=1}^{N} \quad \text{Equation 20}$$

where $\{D\}_j$ denotes the set of SDs obtained from all slices of the j-th volume, for j=1, 2, . . . , N motion-corrupted volumes identified using the above-mentioned method. Thus, the corresponding motion thresholds on SD to those of FD were found.

Online Frame Censoring. The acquisition lengths, that were adaptively determined by SLIMM and VVR-LM, were evaluated for collecting a desired number of motion-free volumes. Additionally, the quality of the collected data was assessed in terms of tSNR, to demonstrate that the motion monitoring system made a correct decision on increasing the length of the acquisition (i.e., with online frame censoring the motion-corrupted volumes were successfully excluded from the data collection). In the experiments, the desired number of volumes was set to be 80% of the total number of volumes on each fMRI data sequence of all data sets that were acquired in this work, and the rest of the 20% of volumes were viewed as the over-scanned volumes in the face of unknown motion-induced data loss without any motion monitoring system applied, as done in the retrospective frame censoring-based methods. It indicated by this setting that the acquisition lengths were manually increased by a fixed rate of 25% (20%+80%) with no motion monitoring. In the experiments, SLIMM and VVR-LM were run separately on each of the data sequences according to the above online frame censoring protocol.

Online Feedback. An experiment was run to validate that SLIMM was able to successfully suggest the scanner operator to intervene in the acquisition through the real-time feedback, if the continuous motion was observed. In the experiment, the motion monitoring system would suggest the operator to stop the acquisition until the subject stopped moving, if no motion-free volumes were collected in the past 30 seconds. During the acquisition, the volunteer was instructed to move continuously to trigger the suggestion of the motion monitoring system. SLIMM was compared to VVR-LM in time when the suggestion for intervention was triggered, since earlier intervention indicated more reduction in the scan duration.

In some embodiments, online feedback may be applied to detect some pattern of motion, regardless of whether the motion is continuous. For example, the motion may be continuous or intermittent. In some embodiments, detecting a pattern of motion allows feedback. For example, the feedback may indicate to a scanner operator to instruct the subject to stop or reduce motion. This, in turn, may allow for sufficient data collection in a reduced amount of time.

In some embodiments, online motion monitoring provides knowledge of the pattern of motion, which may enable the use of online feedback. Through online motion monitoring, it may be possible to see the response to online feedback. For example, it may be possible to tell if the subject stopped moving, if they need further instructions, and/or if they need a break from the scan. In some embodiments, through online motion monitoring, it may also be possible to see whether or not sufficient motion free data has been acquired to the current point in time.

In some embodiments, if the reference volume contains motion above a threshold, it can be damaging to the SVR. Therefore, for a comprehensive investigation, the practical efficacy of the auto-calibration method for the reference volume on the HBN data set (a large-scale data set containing the fMRI scans of 251 pediatric subjects) was examined.

The real-time motion measurement in the SLIMM approach means that the motion of a slice may be measured within the period of its next consecutive slice acquisition. slices processed per second (SPS) was used as an indicator to assess the speed of motion measurement. The SPS for SLIMM was evaluated on the slices from all data sets that were acquired.

Table 2 shows the mean and standard deviation of motion measurement errors obtained from VVR-LM and SLIMM on the EM-Tracking data set. SLIMM outperformed VVR-LM. A t-test was also performed on the errors of motion parameters. In the test, it was assumed that the errors of the motion parameters obtained from the two methods came from normal distributions with unknown, but equal, variances. At 5% threshold for the significance level, the hypothesis was rejected as the p-values were $3.7\times10^{-15}$ for the translation errors and $5.4\times10^{-25}$ for the rotation errors, respectively. This indicated that the transformation errors of the two methods statistically yielded different distributions, and the difference was significant. Consequently, the difference showed the average accuracy gained from slice-by-slice motion measurement in this SVR method in comparison to the method relying on volume-by-volume motion measurement.

Figure 5:
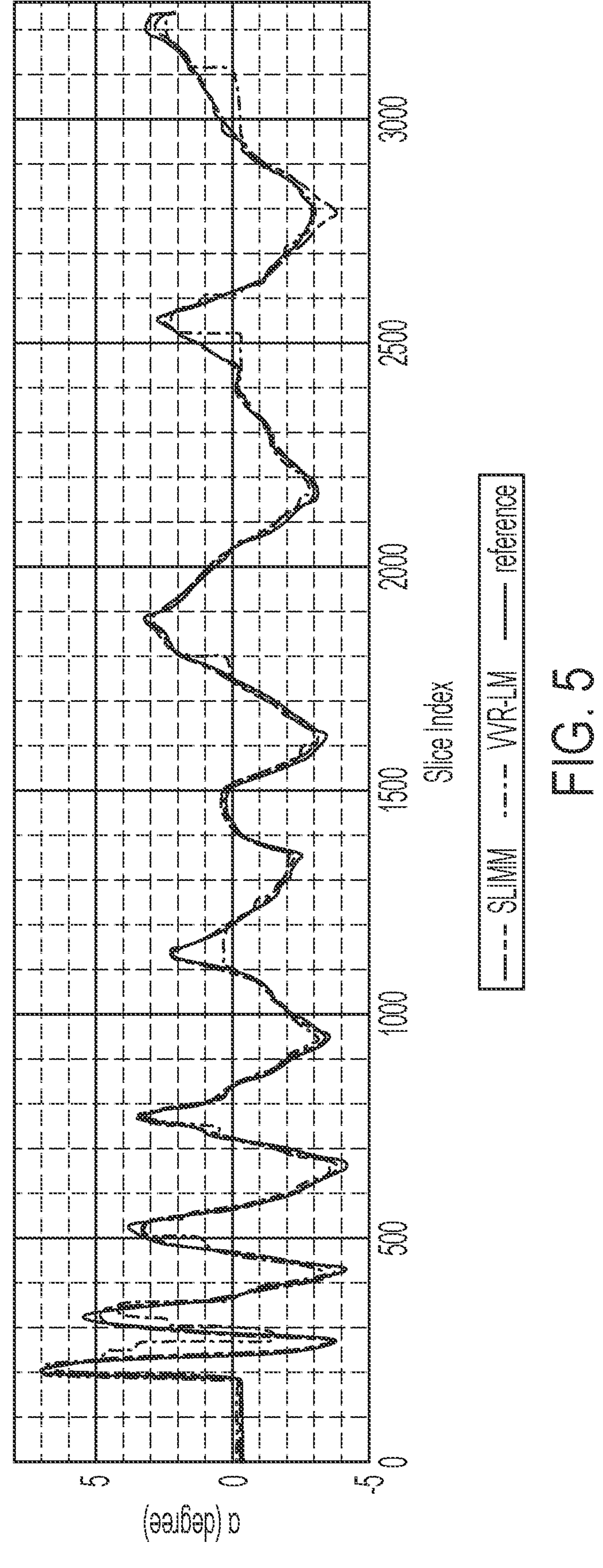
FIG. 5 shows experimental motion measurements obtained from different motion measurement methods, in accordance with some embodiments of the technology described herein.

FIG. 5 shows the motion measurements in terms of rotation parameters α obtained from SLIMM, VVR-LM, and the optical motion tracking system (camera) on the optical motion tracking data set. It can be seen that both VVR-LM and SLIMM, closely followed the real, reference motion pattern measured by the optical tracker. As shown in Table 3, the overall mean and standard deviation of the motion measurement errors in terms of SD obtained from SLIMM are lower than those obtained from VVR-LM. As the subject moved faster at the beginning compared to the end of the sequence, the data points from the range of [200, 300] were analyzed separately. The means and standard deviations of the errors in SD obtained from VVR-LM and SLIMM were shown in Table 3. The SLIMM method outperformed VVR-LM in this period of fast motion.

Overall, the SLIMM approach considerably outperformed the baseline VVR-LM consistently on the real motion data sets in terms of motion measurement error.

TABLE 2

Mean and standard deviation of motion measurement errors in terms of motion transformation parameters and SDs obtained from SLIMM and VVR-LM methods on the EM-Tracking data set. SLIMM, offered sub-voxel slice-level accuracy in this task.

| | Translation (mm) | Rotation (degree) | Displacement (mm) |
|---|---|---|---|
| VVR-LM | 1.17 ± 1.20 | 1.64 ± 3.00 | 3.14 ± 4.36 |
| SLIMM | 0.71 ± 0.64 | 0.77 ± 1.03 | 1.37 ± 1.81 |

TABLE 3

Mean and standard deviation of motion measurement errors in SD obtained from SLIMM and VVR-LM methods on the optical motion tracking data set. SLIMM, offered sub-voxel slice-level accuracy in this difficult task. The difference in performance which showed the advantage of SLIMM was very large for fast motion.

| | Overall (mm) | Fast Motion Period (mm) |
|---|---|---|
| VVR-LM | 0.77 ± 0.94 | 3.12 ± 2.24 |
| SLIMM | 0.32 ± 0.22 | 0.44 ± 0.37 |

Figure 6:
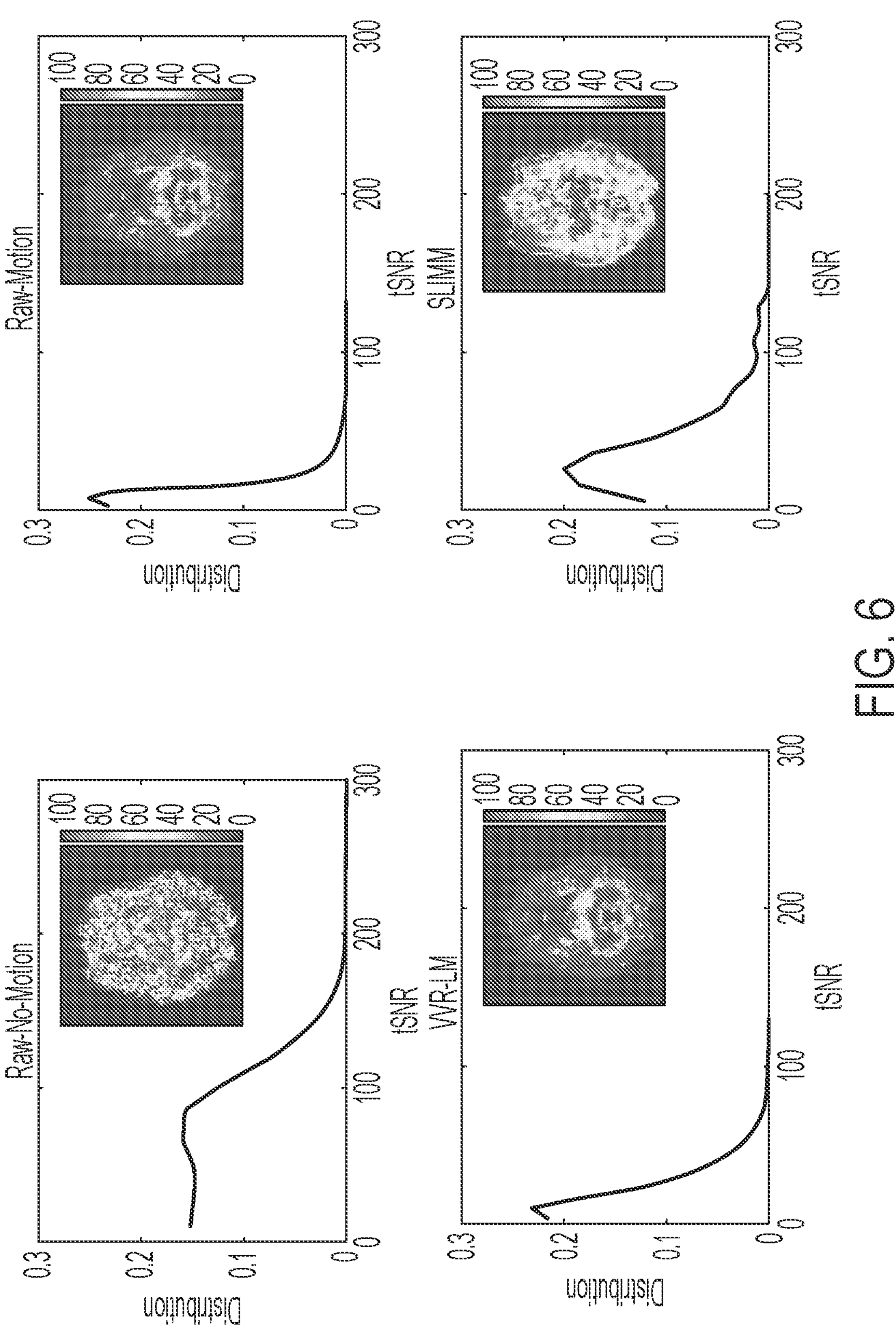
FIG. 6 shows the distributions of the experimental temporal signal-to-noise ratio (tSNR) scores obtained from different motion measurement methods, in accordance with some embodiments of the technology described herein.

FIG. 6 shows the distributions of the tSNR scores obtained from the two motion measurement methods on the EM-Tracking data set of all 6 subjects. The data from the "no motion" reference scans during which the volunteers were asked to hold still were denoted by Raw-No-Motion, and the data with motion were denoted by Raw-Motion. The numbers of the remaining volumes of the 6 subjects were 41, 79, 68, 48, 62, and 54, respectively, when applied frame censoring. Table 4 shows the average tSNR scores over all the voxels of the tSNR volumes on the EM-Tracking data set of the 6 subjects with the frame censoring turned on and off. The tSNRs of Raw-No-Motion had very slight changes when the frame censoring was on and off, whereas, both SLIMM and VVR-LM improved the tSNRs, as compared to the Raw-Motion. SLIMM, considerably outperformed VVR-LM. A tSNR map from a representative subject is also shown in FIG. 6, from which results can be seen that are consistent with the histograms and the average tSNRs.

Table 5 shows the average tSNR scores over all voxels of the tSNR volumes of the original data (i.e., no motion correction applied), and of the retrospectively corrected data through the motion measurements obtained from SLIMM and VVR-LM, respectively, on the subject data set. It can be seen that both the VVR- and SVR-based motion correction methods improved tSNR. It is also evident that, as compared to the VVR-LM method, the SLIMM approach, substantially improved the motion correction performance in terms of tSNR.

In summary, attributed to more accurate motion measurement, the SLIMM approach considerably outperformed the baseline VVR-LM consistently on the real motion data sets in terms of tSNR over the retrospectively corrected data.

TABLE 4

Average tSNR scores on all voxels of the tSNR volumes on the EM-Tracking data set with the frame censoring on (shown without parentheses) and off (shown in parentheses). The best results are highlighted by the bold-face font.

| | Reference scans | | Evaluation results | |
|---|---|---|---|---|
| | Raw-No-Motion | Raw-Motion | VVR-LM | SLIMM |
| Subject 1 | 61.56 | 8.16 | 18.77 | **27.49** |
| | (63.32) | (6.93) | (11.83) | (17.63) |
| Subject 2 | 62.63 | 17.59 | 32.47 | **46.11** |
| | (62.67) | (16.12) | (24.69) | (36.52) |
| Subject 3 | 65.94 | 14.55 | 14.80 | **51.26** |
| | (65.50) | (14.43) | (14.45) | (36.10) |
| Subject 4 | 44.18 | 10.88 | 27.85 | **37.86** |
| | (42.56) | (10.13) | (20.22) | (28.13) |
| Subject 5 | 81.42 | 11.86 | 15.08 | **30.10** |
| | (76.53) | (10.82) | (13.29) | (23.51) |
| Subject 6 | 70.97 | 10.80 | 10.80 | **27.44** |
| | (69.70) | (10.14) | (10.14) | (21.62) |
| mean | 64.76 | 12.33 | 19.87 | **36.83** |
| | (63.72) | (11.45) | (15.71) | (27.28) |

TABLE 5

Average tSNR on all voxels of tSNR volumes on the subject data set. The best results are highlighted by the bold-face font. Compared to VVR-LM, SLIMM substantially improved the tSNR on all 3 subject data sequences.

| | Original Data | VVR-LM | SLIMM |
|---|---|---|---|
| Subject #1 (resting state) | 35.89 | 40.72 | **47.29** |
| Subject #2 (resting state) | 52.23 | 55.48 | **62.81** |
| Subject #3 (finger tapping) | 28.21 | 30.17 | **35.45** |

Figure 7:
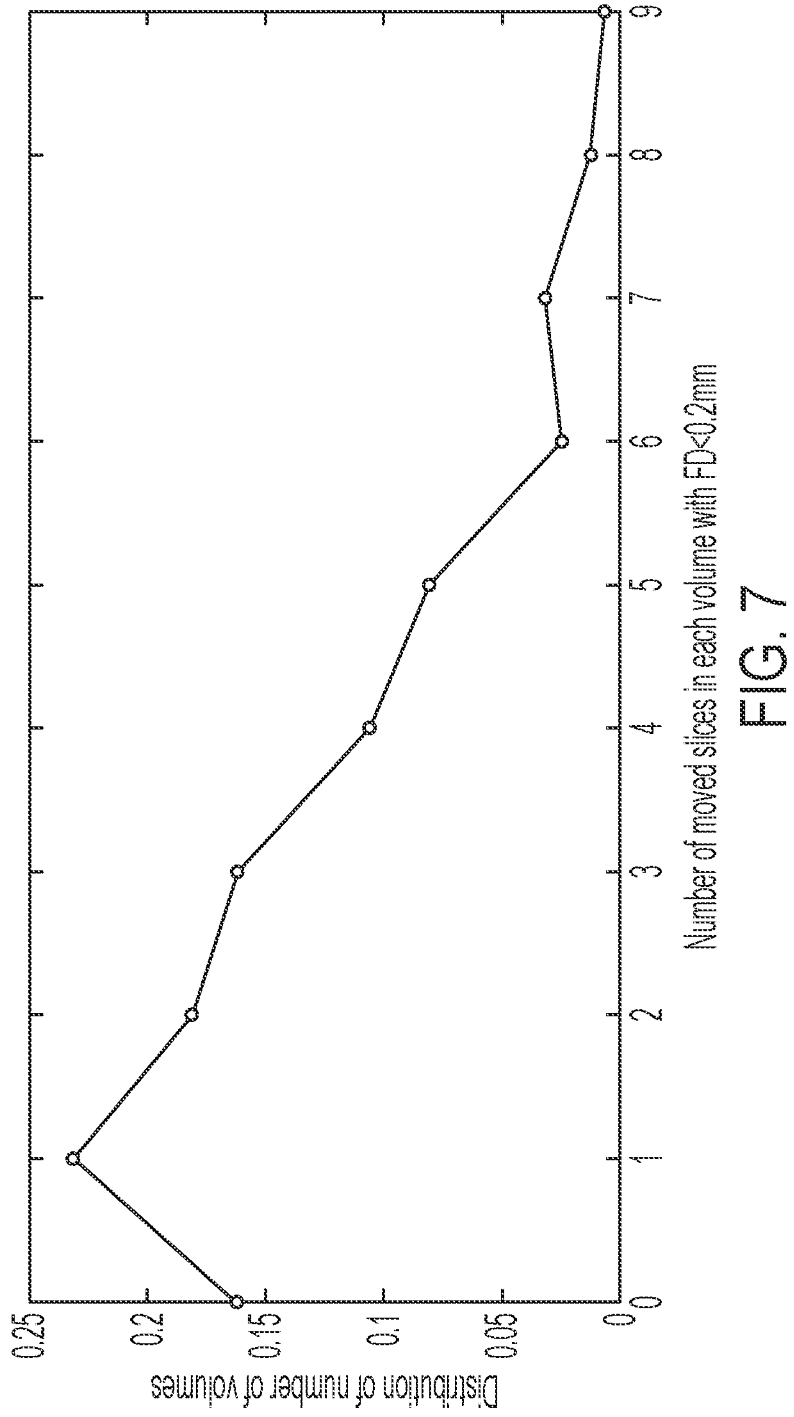
FIG. 7 shows the experimental distribution of the number of volumes with regard to the number of slices of the volume impacted by motion, in accordance with some embodiments of the technology described herein.

FIG. 7 shows the distribution of the number of volumes with regard to the number of slices of the volume impacted by motion, considering only those volumes with an FD<0.2 mm on the EM-Tracking data set. The SDs measured from over 10,000 slices were investigated by using the electromagnetic motion tracking sensor. Only 16.5% volumes had all of its slices exhibit displacement less than 0.2 mm, while the rest volumes contained at least one slice subject to SD≥0.2 mm. FIG. 7 shows that even when volumes meet the criterion of FD<0.2 mm, there are often many slices displaced by over 0.2 mm.

Figure 8:
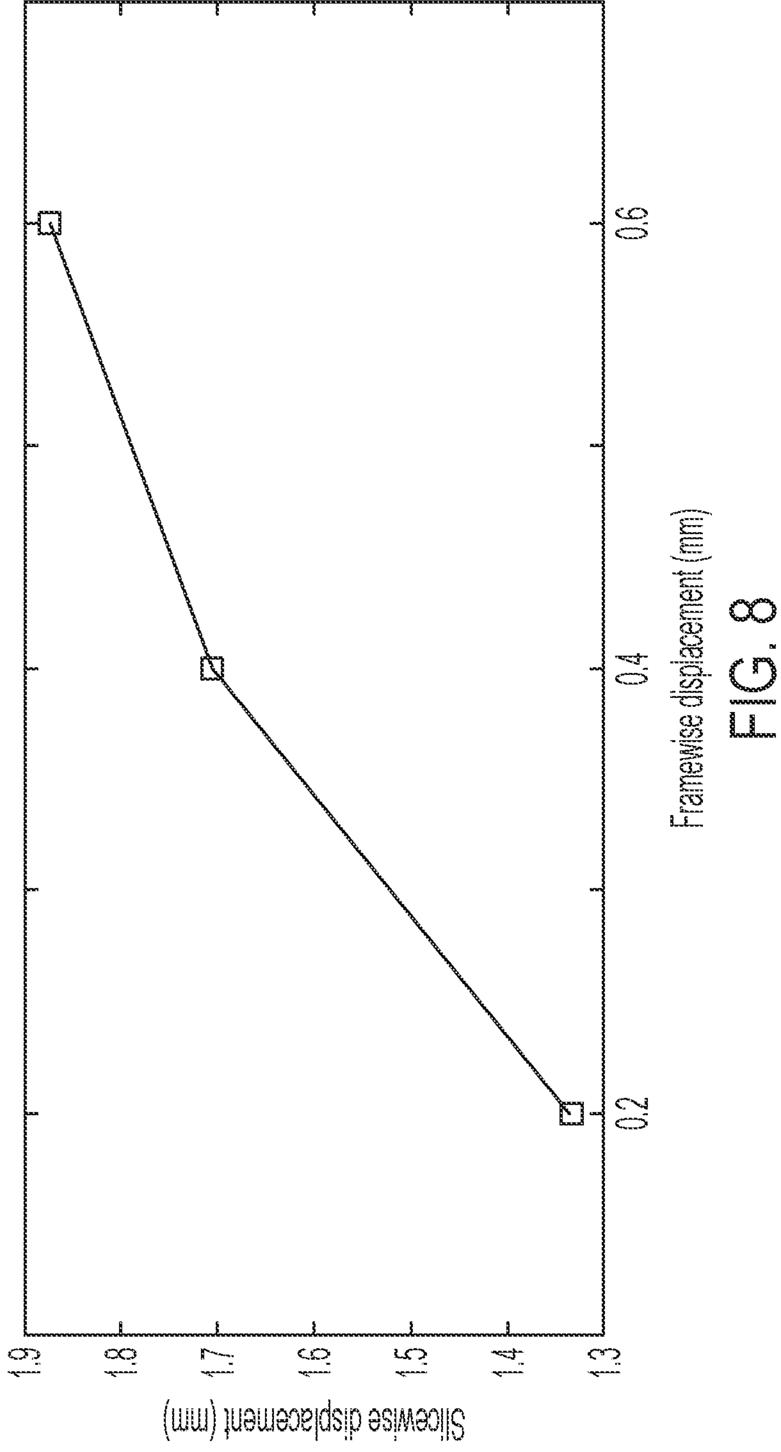
FIG. 8 shows the corresponded threshold values between slice displacements (SDs) and frame displacements (FDs), in accordance with some embodiments of the technology described herein.

FIG. 8 shows the corresponded threshold values between SDs and FDs on the EM-Tracking data set. The most widely used threshold on FD ranges from 0.2 mm to 0.6 mm, from high to low. The corresponding threshold on SD on this data set was between 1.33 mm and 1.87 mm, from high to low.

FIG. 8 shows that VVR-LM was unaware of a moved slice in a volume with an FD=0.2 mm unless this slice displaced at least 1.33 mm. Considering the widely used FD threshold is between 0.2 and 0.4 mm, according to this result, the SD threshold was set to range from one fourth to a half of the slice thickness in all experiments. In this experiment, ensuring that all slices of a collected volume displaced less than 0.2 mm in VVR-LM with a threshold of 0.2 mm on the FD was not achieved. In contrast, according to the protocol described herein above, a collected volume by SLIMM guaranteed that all its slices had a motion amount of less than one-fourth of the slice thickness.

Table 6 shows the results of experiments with and without motion monitoring on the fMRI sequences of all the data sets that were acquired. Table 7 shows details of the results on the subject data set. Since only 20% of the total number of volumes on each fMRI data sequence were preserved for extending the acquisitions with motion monitoring, there were too many failures in acquiring the desired numbers of motion-free volumes (i.e., over 20% of volumes were excluded from the data collection) when the motion threshold of one fourth of the slice thickness was used for both VVR-LM and SLIMM in this experiment. Therefore, the motion threshold was increased to half of the slice thickness. The lengths of the acquisitions with motion monitoring were shorter than those without motion monitoring. SLIMM took longer acquisitions on average than VVR-LM, since SLIMM performed more accurately in measuring intra-volume motion, and thus successfully identified more volumes containing slices that were subject to motion that VVR-LM overlooked. As a result, SLIMM correctly determined to increase the acquisition lengths. The data quality was improved by excluding all volumes with motion. As shown in Table 6, the tSNR of the motion-corrected data was improved on average by around 88% with SLIMM, and by around 37% with VVR-LM.

TABLE 6

Analysis results of the two motion monitoring methods on all data sets that were acquired with the motion threshold of half of the slice thickness on SD (for SLIMM) and FD (for VVR-LM). Both methods reduced the scanning duration; but SLIMM led to much higher data quality (according to tSNR) compared to VVR-LM at the cost of only marginally longer scans (measured by length of increment rate).

| Length increment rate | | | tSNR gain | | |
|---|---|---|---|---|---|
| No Monitoring | VVR-LM | SLIMM | No Monitoring | VVR-LM | SLIMM |
| 25% | 16.67% | 17.86% | — | 37.15% | 88.04% |

TABLE 7

Analysis results of the two motion monitoring methods on the subject data set with the motion threshold of half of the slice thickness on SD (for SLIMM) and FD (for VVR-LM). Compared to no motion monitoring and VVR-LM, SLIMM collected the minimum necessary amount of data (based on the predefined criteria), leading to improved data quality (in terms of tSNR) and reduced scanning time (in terms of number of actually acquired volumes).

| | # of volumes actually acquired | | | | tSNR score | | |
|---|---|---|---|---|---|---|---|
| | Expected | No Monitoring | VVR-LM | SLIMM | No Monitoring | VVR-LM | SLIMM |
| Subject #1 | 128 | 160 | 133 | 135 | 35.89 | 43.96 | 47.11 |
| Subject #2 | 128 | 160 | 128 | 128 | 52.23 | 61.09 | 70.01 |
| Subject #3 | 76 | 96 | 79 | 80 | 28.21 | 31.65 | 35.67 |

Figure 9A:
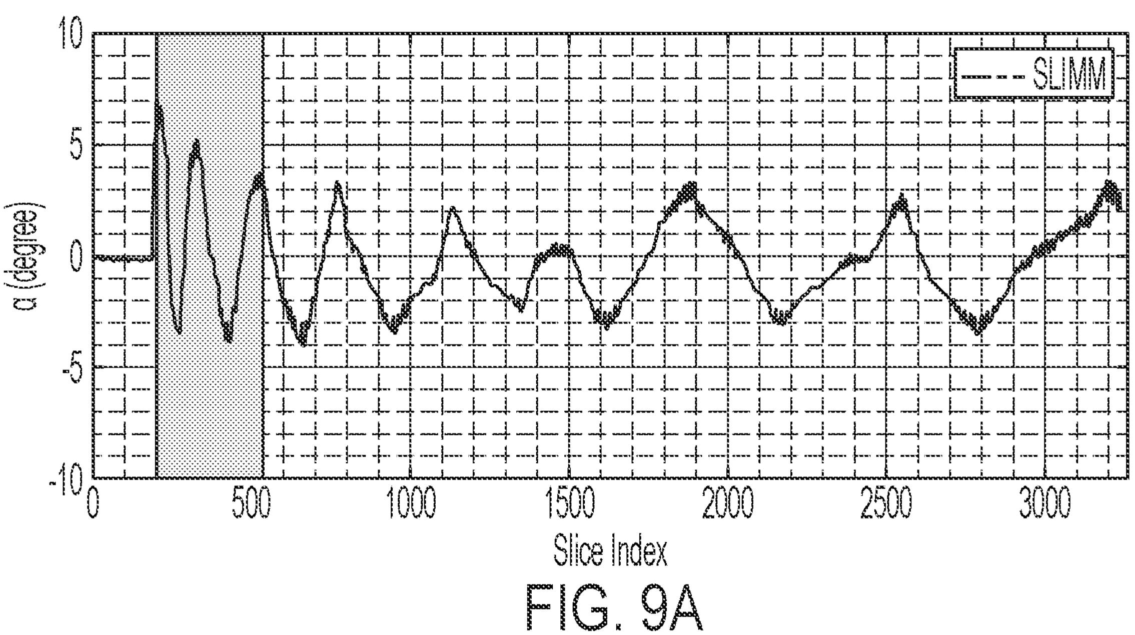
FIG. 9A shows example acquisition data with interventions suggested by SVR motion monitoring techniques, in accordance with some embodiments of the technology described herein.
Figure 9B:
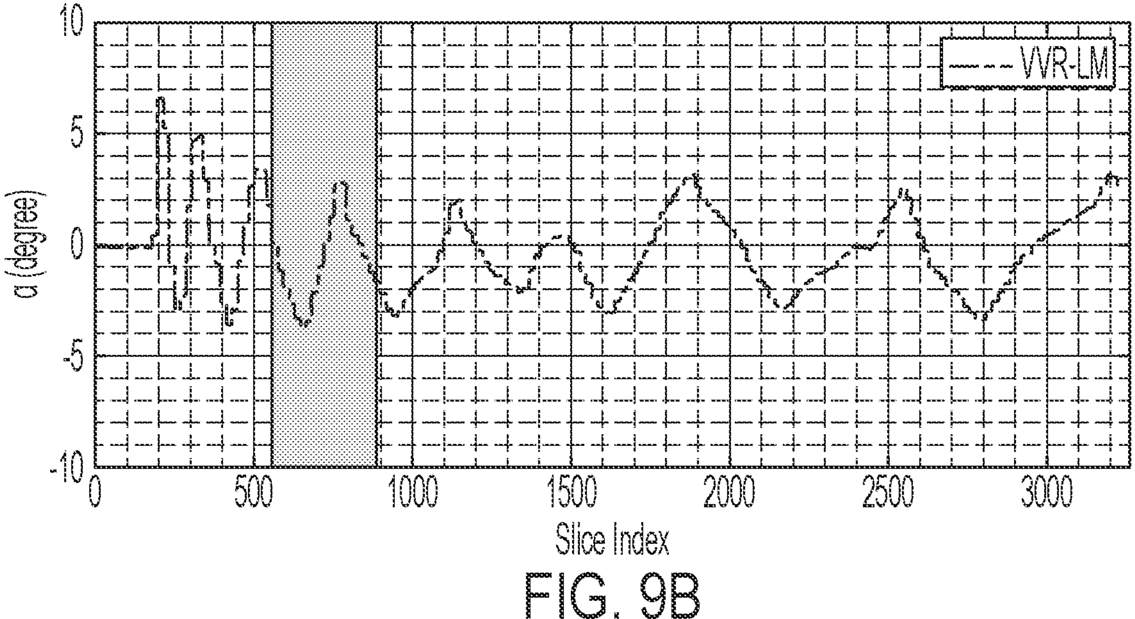
FIG. 9B shows example acquisition data with interventions suggested by volume-to-volume registration (VVR) motion monitoring techniques, in accordance with some embodiments of the technology described herein.

FIGS. 9A and 9B show the results of the acquisitions with intervention online monitored by SLIMM and VVR-LM, respectively. The shaded region in each of FIGS. 9A and 9B indicate periods wherein no motion-free (e.g., motion below a threshold) data was collected in the past 30 seconds. With a motion threshold of one fourth of the slice thickness, the SLIMM motion monitoring system was aware of the continuous motion when 10 volumes have been acquired, as shown in FIG. 9A, and suggested operator to intervene in the scan at the 30th volume. In contrast, with the same motion threshold, VVR-LM was unable to trigger the suggestion for intervention. When the threshold was decreased to 0.2 mm, VVR-LM started responding to the continuous motion at the 30th volume, as shown in FIG. 9B, and suggested intervention when 50 volumes have been acquired. The results showed that both motion monitoring systems were able to reduce the scan times by enabling early intervention through their online feedback. SLIMM suggested intervening in the scan much earlier than VVR-LM, and correspondingly further reduced more scan duration and more associated costs.

Figure 10:
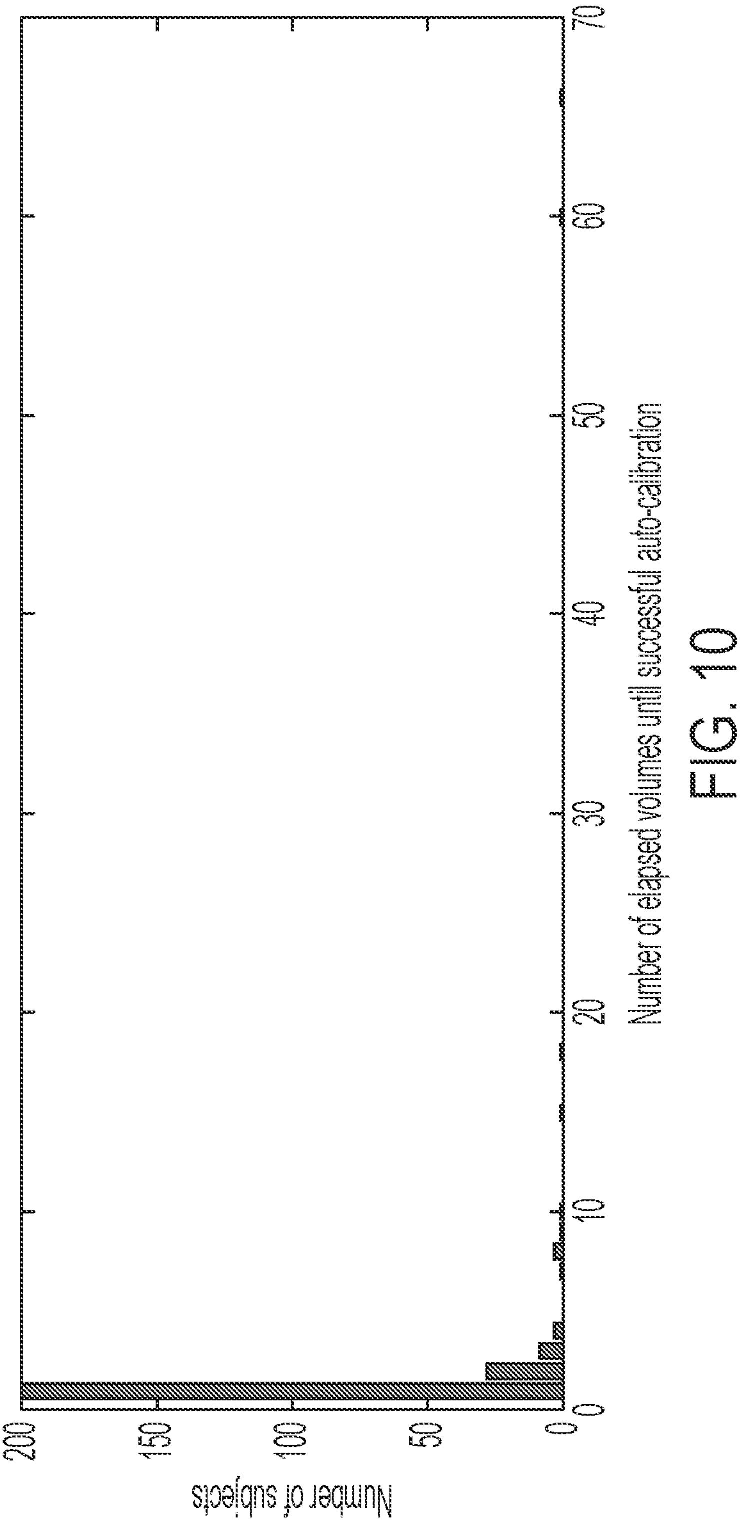
FIG. 10 shows the experimental distribution of the number of subjects over number of elapsed volumes until auto-calibration was successful, in accordance with some embodiment of the technology described herein.

FIG. 10 shows the distribution of subjects as a function of the number of elapsed volumes until successful auto-calibration. A threshold of one fourth of the slice thickness was used on motion measurements of all slices as an indicator for motion. For about 80% of the subjects on the HBN data set, auto-calibration was completed after the acquisition of the second volume. In these cases, the first volume was automatically selected as the reference. The distribution in FIG. 10, with its heavy-tailed shape, also shows that for a few subjects, much more fMRI volumes elapsed until a "motion-free" period was detected to complete the auto-calibration. According to the fMRI protocol, a volume can be acquired within 1.5 seconds with the interleaved and simultaneous multi-slice scheme. With this data, the average time of auto-calibration would be 5.7 seconds; for 99.5% of the subjects on the HBN data set the auto-calibration time was less than 30 seconds; and only for two cases (among 251 subjects) the auto-calibration took 90-110 seconds. In fact, this analysis and the heavy-tailed distribution of the auto-calibration time also provides another evidence for the necessity of real-time motion monitoring to ensure useful fMRI scans are acquired for all subjects within a cohort.

The SPS of SLIMM was evaluated on the slices from all the data sets that were acquired. The average SPS was 27.7, i.e., the average time taken in measuring the motion of a slice was ~36 ms. According to the fMRI protocol, it took about 80 ms to acquire a simultaneous-2-slice. It thus suggested that SLIMM enabled real-time performance for motion monitoring with the fMRI protocol.

The experimental results have shown that SLIMM led to substantial improvements in the accuracy of motion measurement, and in turn in acquisition efficiency and quality, over the widely-used VVR-based motion monitoring method, resulting in reduced imaging cost and improved data quality.

In some embodiments, SVR (VVR) is able to estimate the position and orientation of the subject's head as the corresponding slice (the volume for VVR) has been acquired, referring to a motion-free (e.g., no motion above a threshold) volume as the motion reference. In some embodiments, motion may thus be identified from the difference of the motion parameters between the estimate and the reference. In general, SD (FD for VVR) may be used to identify motion, which may be calculated from the difference of the motion parameters between two consecutively acquired slices (volumes for VVR). Motion typically happens at the slice level, rather than just at the periods between the acquisitions of consecutive volumes, in the 2D EPI-based fMRI acquisition. By this nature, the VVR-based methods estimate the motion less accurately and have high temporal delays to be aware of the motion. Since the VVR-based estimate integrates the information from all slices of a volume of interest in the registration, VVR leads to two types of motion identification errors, depending on the time when motion occurs during a single volume acquisition:

False positive. This type of error commonly happens in the case of fast and abrupt motion. As shown in FIG. 5, false positive happened in the acquisition with the VVR-LM motion monitoring system at the period between data points of [200,400] where fast motion occurred. By referring to the optical motion tracking results, VVR-LM had an obvious latency to identify the volumes acquired when fast and abrupt motion happened as motion-corrupted by mistake. Since VVR-LM took all the slices of a real motion-corrupted volume into consideration, it was able to estimate that the volume was corrupted by motion, but the estimated motion amount may be lower than it actually was. This residual led to the false positive error at the next volume, even if the position and orientation of the next volume were accurately estimated.

False negative. This type of error is the major factor to affect the accuracy of VVR, and in particular when frequent motion happened. In the case that the subject moves at the time near the end of a volume acquisition, i.e., only a few slices are corrupted by the motion, the VVR-based monitoring system shows no motion observed, even if the motion amount is high. As shown in Tables 6 and 7, the VVR-LM motion monitoring system yielded slightly higher efficiency in terms of length increment rate than SLIMM, but much lower quality in terms of tSNR. This was caused by the fact that VVR-LM missed to identify the motion and collected by mistake these motion-corrupted volumes.

In some embodiments, the protocol for collecting data with SLIMM is that a volume would be excluded, if any of its slices are motion-corrupted. As a result, SLIMM leads to the above errors at a very low probability, i.e., only when intra-slice motion happens. Considering the EPI slices are acquired very fast (60-80 ms), the above errors can be negligible in SLIMM. This is the major reason that SLIMM substantially improved the monitoring efficiency and data quality, and considerably decreased the temporal monitoring delay, as compared to VVR-LM.

In some embodiments, the frame displacement (FD) may be computed by the sum of absolute head movement in all six rigid body directions from two consecutively acquired volumes. However, any suitable definition may be used, as aspects of the embodiments described herein are not limited in this respect. For example, a Euclidean distance could be used in place of the Manhattan distance described above, and a chord length could be used instead of an arc length. Let $T_{i-1}$ and $T_i$ be consecutive rigid body transforms aligning each of the consecutive volumes number (i−1) and i to a reference volume. The transform that describes the change in position and orientation between these two volumes is then $$T = T_{i-1}(T_i)^{-1},$$

the composition of the transform aligning the volume at the prior position to the reference volume, with the transform from the reference volume to the current position. Other measures of displacement using this composed transformation are possible.

In some embodiments, the FD may be generalized to slices, as denoted by the slice displacement (SD), by considering the possibility that each slice, not just each volume, may undergo an independent rigid body transformation. In some embodiments, the SD measure may be used for monitoring motion occurring at the slice level. When imaging subjects, the head may undergo rigid body motion at any time during the slice readout, not only at the times that are instants between different volumes. Consequently, although rigid body motion may be assumed for the volumes in order to calculate the FD, the motion of the collection of slices in the volume cannot always be described as a single rigid body motion. Instead, in some embodiments, the possibility of rigid body motion at each slice may be considered. In some embodiments, the observed motion of the slices $j \in \{1, \ldots, n\}$ of the volume i may then be $SD_{ji}$ with n being the number of slices per volume. The sum of the displacements of each slice of a volume may then be a measure of the total displacement during the volume acquisition, but this may not be equal, in general, to the FD which assumes one rigid body transform describes the motion of all of the slices:

$$\sum_{j}^{n} SD_{ji} \neq FD_i.$$

Consequently, in some embodiments, the FD measure may represent the displacement of an overall rigid body transformation that is estimated by the rigid registration when one or more of the slices may be displaced by different rigid body transformations. In contrast, in some embodiments, the SD measure may reflect the change in position of the slice that undergoes rigid body transformation, which may be easy to interpret.

Note also that, in some embodiments, if the slice is not encoded correctly, or there is motion during the acquisition of calibration lines used to compute the GRAPPA kernel, or coil sensitivity profiles for SENSE, severe signal intensity artifacts may be present, and such slices or volumes may be dropped from consideration rather than used in the computation of an alignment.

The most widely used protocol in motion monitoring is to impose a motion threshold on FD. In some embodiments, if a volume has an FD less than the threshold, it is considered as motion-free and accepted to be collected; otherwise, the volume is regarded as motion-corrupted and excluded from the data collection (frame censoring). In general, the threshold is set between 0.2 and 0.4 mm from high to low. In some embodiments, using a higher threshold is more sensitive to small motion, and excludes more volumes during the monitored acquisition, leading to longer scans but higher data quality. Using a lower threshold may tolerate more significant motion, and thus collects more volumes with low movements, resulting in shorter scans but lower data quality. As a result, it is a trade-off to set a motion threshold for the monitored acquisition between motion sensitivity and motion tolerance.

In motion monitoring system at the slice level, subject motion may be measured slice by slice. Therefore, SD may be leveraged, instead of FD, to identify if a slice displaces. In some embodiments, the protocol used in SLIMM was to exclude a volume if the volume contained any motion-corrupted slices; and otherwise, to collect it.

As addressed above, while it has been determined empirically that an FD of between 0.2 mm and 0.4 mm indicates the amount of motion that can be tolerated during an fMRI experiment, this numerical value cannot be used for SD, because the FD represents the displacement of an overall rigid body transformation that is estimated by the rigid registration when one or more of the slices may be displaced by different rigid body transformations. The threshold on SD was set at one fourth and half of the slice thickness, from high to low. This setting was much lower than that used for FD thresholding in the numerical value. However, it did not indicate that significant motion was tolerated in the experiments. The results of the experiments demonstrated that one fourth of the slice thickness may be high enough to the SD thresholding, in some embodiments, since a volume was examined slice by slice under this criterion. In fact, it was unable to ensure that all slices of a collected volume displaced less than 0.2 mm in VVR-LM with a high threshold of 0.2 mm on the FD. A slice may displace up to 1.33 mm within a volume of FD less than 0.2 mm according to the results that have shown in FIG. 8. In contrast, a collected volume by SLIMM was guaranteed that all its slices had a motion amount of less than one fourth of the slice thickness. This was also the reason that SLIMM performed with more accurate motion measurement than VVR-LM. For consistency, the same motion threshold of one fourth of the slice thickness was used in the experiments for both SLIMM and VVR-LM. Such a setting was preferred by VVR-LM for low acquisition duration in the experiments. Although it was unfair to SLIMM with this threshold setting, the experimental results have still shown that SLIMM considerably outperformed VVR-LM consistently on various data sets.

As described herein, SLIMM acquired more volumes than VVR-LM, while achieved much higher improvement in data quality in terms of tSNR. During the acquisitions, SLIMM correctly identified that there were slices that were subject to motion that VVR-LM overlooked. Consequently, SLIMM was able to correctly recommend increasing the scan duration to account for the motion-corrupted data that was incorrectly missed by VVR-LM, since VVR-LM examined only volumes. As a result, motion monitoring (with either SLIMM or VVR-LM) led to fewer actually acquired volumes and thus reduced the scan duration compared to acquisitions with no motion monitoring, and SLIMM led to much higher data quality (according to tSNR) than VVR-LM.

If the subject does not move at all, and the VVR-LM user knows ahead of time that the subject will not move, then head motion is not a concern, and both SLIMM and VVR-LM may lead to the same quality of data and the same minimum scan time. In practical fMRI acquisitions, however, head motion is an important confounder in fMRI studies, and is common and widespread. Consequently, it may be desirable to mitigate against the possibility of motion.

If there is intra-volume slice motion, then SLIMM may indicate, in some embodiments, the need to acquire additional data, and VVR-LM may fail to detect the motion, and falsely indicate there is no problem, when there is a problem. This leads to worse tSNR with VVR-LM. If there is intra-volume slice motion, and detectable volume-to-volume motion, then again SLIMM may indicate, in some embodiments, the need to acquire additional data, and VVR-LM will indicate the need to acquire some additional data. Since VVR-LM is insensitive to some motion, it may fail to fully signal the true extent of motion, leading to a worse tSNR with VVR-LM in addition to extended scan time.

When the designer of an fMRI experiment considers monitoring motion with VVR-LM and acknowledges that 1) motion is common and 2) VVR-LM does not detect all the motion, and 3) reduced tSNR is bad for data analysis, then they may prefer to mitigate against the possibility of motion, and consequent data quality loss, by acquiring additional data. Extending the scan time may lead to the capture of sufficient data to compensate for the tSNR loss that occurs with VVR-LM motion monitoring. Thus, the VVR-LM user chooses to extend their scan time beyond the minimum, in order to mitigate against the possibility of unrecognized head motion, and to restore some lost tSNR (without knowing how successful they will be). In comparison, the SLIMM user who does not know if their subject will move or will not move, may not need to extend the scan time in case there is unmonitored motion because the motion may be monitored, and may use a shorter scan time to achieve the desired tSNR. The VVR-LM users who is certain that their subjects will either not move at all, or will not exhibit unmonitored motion, are able to achieve the same short scan time and sufficient tSNR as SLIMM. However, in designing practical fMRI acquisitions, it is usually not possible to know before imaging that subjects will not move or will not exhibit motion that VVR-LM is insensitive to. As a result, a designer planning to use VVR-LM for motion monitoring instead of SLIMM should choose to run for a longer scan time in order to expect to achieve the same desired level of tSNR.

In addition, both the motion monitoring systems were able to provide simultaneous feedback to the operator to enable immediate intervention for the scans. Therefore, the scan times and the associated costs were substantially reduced. Moreover, SLIMM suggested intervening in the scan much earlier than VVR-LM for the acquisitions with continuous subject motion, since SLIMM was able to correctly identify the motion-corrupted slices that VVR-LM overlooked during the monitoring. It indicated that SLIMM further saved more scan time and more associated costs than VVR-LM.

In some embodiments, the SLIMM algorithm may be used with sequences where one single slice is acquired at a time, instead of using SMS. The potential advantage of SMS is that two or more slices maximally separated across a volume of n slices may have a more accurate and stable registration optimum than one slice alone. One slice alone may even be outside of the brain or contain a very small amount of brain tissue at the edge of the brain, which may lead some slices to have poor alignment. In some embodiments, this type of error may be tolerated when doing motion monitoring, but it may be mitigated by using more than one slice for the motion monitoring even when a single slice at a time is acquired. This may lead to a slower update rate for the motion monitoring but remains much faster than volume to volume motion monitoring.

In the demonstration of the auto-calibration method for the reference volume, experimental results in a large cohort of pediatric subjects in FIG. 10 showed that the auto-calibration method quickly found a reference volume for the majority of subjects. In a few cases with significant motion, it took a relatively long time. This analysis showed the efficacy of the auto-calibration method, and also showed the importance of motion monitoring during fMRI acquisitions. It indicated that it may not be advisable to rely on a long acquisition protocol and expect to get sufficient data for all cases in a cohort. Without real-time motion monitoring, a large number of pediatric subjects may be scanned for unnecessary long scan time, and yet not be successful in acquiring useful data for some subjects. These issues with subject motion become more prominent when studying and scanning non-cooperative subject populations such as infants, toddlers, and young children. With real-time motion monitoring and an adaptive strategy for extending the length of fMRI scans, until a desirable number of "motion-free" periods are collected, it is possible to ensure that an fMRI protocol runs efficiently for a cohort of subjects and subjects as well as for an individual in critical condition scanned in a clinical setting, e.g., for presurgical planning. Therefore, real-time motion monitoring may result in a substantial reduction in average scan times, reduce the burden of long acquisitions on subjects, and reduce the costs and delays associated with repeated acquisitions. This approach (SLIMM) may provide a cost-efficient and safe, self-navigated, fast, slice-level motion monitoring system, that may be employed without an external hardware attachment or pulse sequence modification, therefore it can be safely and easily used with different fMRI paradigms for pediatric and non-cooperative subjects.

Example Processing Techniques

Techniques operating according to the principles described herein may be implemented in any suitable manner. Included in the discussion above are a series of flow charts showing the steps and acts of various processes that analyze MR data to evaluate an image that would result from an MRI scan. The processing and decision blocks of the flow charts above represent steps and acts that may be included in algorithms that carry out these various processes. Algorithms derived from these processes may be implemented as software integrated with and directing the operation of one or more single- or multi-purpose processors, may be implemented as functionally-equivalent circuits such as a Digital Signal Processing (DSP) circuit or an Application-Specific Integrated Circuit (ASIC), or may be implemented in any other suitable manner. It should be appreciated that the flow charts included herein do not depict the syntax or operation of any particular circuit or of any particular programming language or type of programming language. Rather, the flow charts illustrate the functional information one skilled in the art may use to fabricate circuits or to implement computer software algorithms to perform the processing of a particular apparatus carrying out the types of techniques described herein. It should also be appreciated that, unless otherwise indicated herein, the particular sequence of steps and/or acts described in each flow chart is merely illustrative of the algorithms that may be implemented and can be varied in implementations and embodiments of the principles described herein.

Accordingly, in some embodiments, the techniques described herein may be embodied in computer-executable instructions implemented as software, including as application software, system software, firmware, middleware, embedded code, or any other suitable type of computer code. Such computer-executable instructions may be written using any of a number of suitable programming languages and/or programming or scripting tools, and also may be compiled as executable machine language code or intermediate code that is executed on a framework or virtual machine.

When techniques described herein are embodied as computer-executable instructions, these computer-executable instructions may be implemented in any suitable manner, including as a number of functional facilities, each providing one or more operations to complete execution of algorithms operating according to these techniques. A "functional facility," however instantiated, is a structural component of a computer system that, when integrated with and executed by one or more computers, causes the one or more computers to perform a specific operational role. A functional facility may be a portion of or an entire software element. For example, a functional facility may be implemented as a function of a process, or as a discrete process, or as any other suitable unit of processing. If techniques described herein are implemented as multiple functional facilities, each functional facility may be implemented in its own way; all need not be implemented the same way. Additionally, these functional facilities may be executed in parallel and/or serially, as appropriate, and may pass information between one another using a shared memory on the computer(s) on which they are executing, using a message passing protocol, or in any other suitable way.

Generally, functional facilities include routines, programs, objects, components, data structures, etc. that perform particular tasks or implement particular abstract data types. Typically, the functionality of the functional facilities may be combined or distributed as desired in the systems in which they operate. In some implementations, one or more functional facilities carrying out techniques herein may together form a complete software package. These functional facilities may, in alternative embodiments, be adapted to interact with other, unrelated functional facilities and/or processes, to implement a software program application, for example as a software program application such as a signal analysis facility.

Some exemplary functional facilities have been described herein for carrying out one or more tasks. It should be appreciated, though, that the functional facilities and division of tasks described is merely illustrative of the type of functional facilities that may implement the exemplary techniques described herein, and that embodiments are not limited to being implemented in any specific number, division, or type of functional facilities. In some implementations, all functionalities may be implemented in a single functional facility. It should also be appreciated that, in some implementations, some of the functional facilities described herein may be implemented together with or separately from others (i.e., as a single unit or separate units), or some of these functional facilities may not be implemented.

Computer-executable instructions implementing the techniques described herein (when implemented as one or more functional facilities or in any other manner) may, in some embodiments, be encoded on one or more computer-readable media to provide functionality to the media. Computer-readable media include magnetic media such as a hard disk drive, optical media such as a Compact Disk (CD) or a Digital Versatile Disk (DVD), a persistent or non-persistent solid-state memory (e.g., Flash memory, Magnetic RAM, etc.), or any other suitable storage media. Such a computer-readable medium may be implemented in any suitable manner, including as computer-readable storage media 1106 of FIG. 11 described below (i.e., as a portion of a computing device 1100) or as a stand-alone, separate storage medium. As used herein, "computer-readable media" (also called "computer-readable storage media") refers to tangible storage media. Tangible storage media are non-transitory and have at least one physical, structural component. In a "computer-readable medium," as used herein, at least one physical, structural component has at least one physical property that may be altered in some way during a process of creating the medium with embedded information, a process of recording information thereon, or any other process of encoding the medium with information. For example, a magnetization state of a portion of a physical structure of a computer-readable medium may be altered during a recording process.

Figure 11:
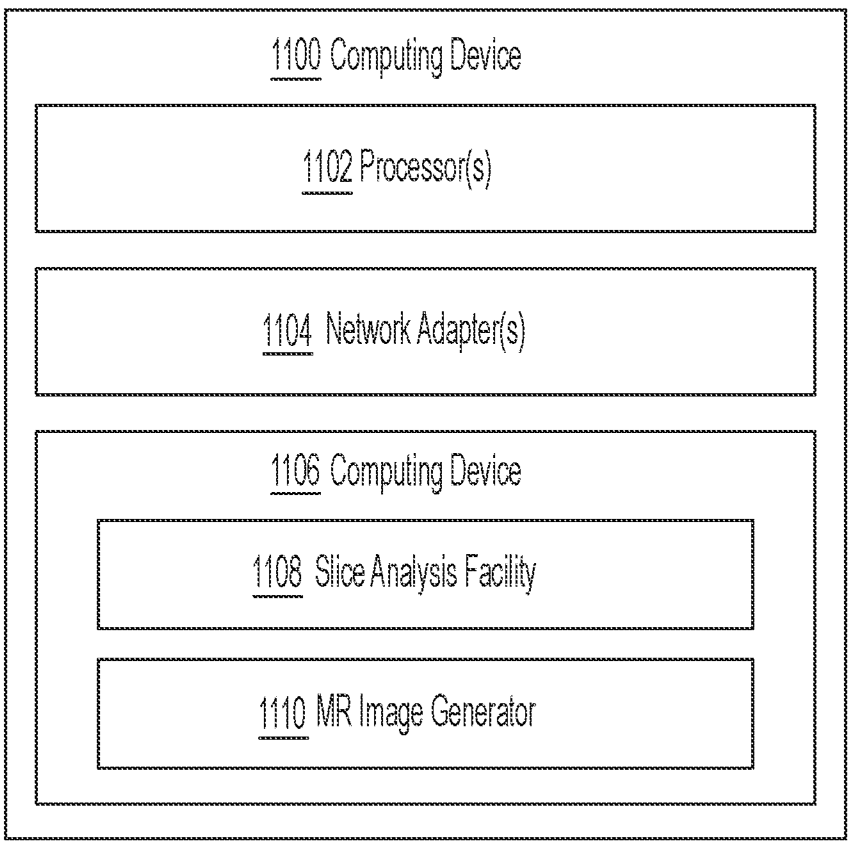
FIG. 11 is a schematic diagram of an illustrative computing device with which aspects described herein may be implemented.

In some, but not all, implementations in which the techniques may be embodied as computer-executable instructions, these instructions may be executed on one or more suitable computing device(s) operating in any suitable computer system, including the exemplary computer system of FIG. 11, or one or more computing devices (or one or more processors of one or more computing devices) may be programmed to execute the computer-executable instructions. A computing device or processor may be programmed to execute instructions when the instructions are stored in a manner accessible to the computing device or processor, such as in a data store (e.g., an on-chip cache or instruction register, a computer-readable storage medium accessible via a bus, a computer-readable storage medium accessible via one or more networks and accessible by the device/processor, etc.). Functional facilities comprising these computer-executable instructions may be integrated with and direct the operation of a single multi-purpose programmable digital computing device, a coordinated system of two or more multi-purpose computing device sharing processing power and jointly carrying out the techniques described herein, a single computing device or coordinated system of computing devices (co-located or geographically distributed) dedicated to executing the techniques described herein, one or more Field-Programmable Gate Arrays (FPGAs) for carrying out the techniques described herein, or any other suitable system.

FIG. 11 illustrates one exemplary implementation of a computing device in the form of a computing device 1100 that may be used in a system implementing techniques described herein, although others are possible. It should be appreciated that FIG. 11 is intended neither to be a depiction of necessary components for a computing device to operate as a device for evaluating an image that would result from an MRI scan in accordance with the principles described herein, nor a comprehensive depiction.

Computing device 1100 may comprise at least one processor 1102, a network adapter 1104, and computer-readable storage media 1106. Computing device 1100 may be, for example, a desktop or laptop personal computer, a personal digital assistant (PDA), a smart mobile phone, or any other suitable computing device. Network adapter 1104 may be any suitable hardware and/or software to enable the computing device 1100 to communicate wired and/or wirelessly with any other suitable computing device over any suitable computing network. The computing network may include wireless access points, switches, routers, gateways, and/or other networking equipment as well as any suitable wired and/or wireless communication medium or media for exchanging data between two or more computers, including the Internet. Computer-readable media 1106 may be adapted to store data to be processed and/or instructions to be executed by processor 1102. Processor 1102 enables processing of data and execution of instructions. The data and instructions may be stored on the computer-readable storage media 1106.

The data and instructions stored on computer-readable storage media 1106 may comprise computer-executable instructions implementing techniques which operate according to the principles described herein. In the example of FIG. 11, computer-readable storage media 1106 stores computer-executable instructions implementing various facilities and storing various information as described above. Computer-readable storage media 1106 may store slice analysis facility

1108 configured to evaluate an image that would result from an MRI scan. Media 1106 may also store an MR image generator 1110 to generate one or more images from signals captured during an MRI scan.

While not illustrated in FIG. 11, a computing device may additionally have one or more components and peripherals, including input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computing device may receive input information through speech recognition or in other audible format.

Embodiments have been described where the techniques are implemented in circuitry and/or computer-executable instructions. It should be appreciated that some embodiments may be in the form of a method, of which at least one example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Various aspects of the embodiments described above may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," "having," "containing," "involving," and variations thereof herein, is meant to encompass the items listed thereafter and equivalents thereof as well as additional items.

The word "exemplary" is used herein to mean serving as an example, instance, or illustration. Any embodiment, implementation, process, feature, etc. described herein as exemplary should therefore be understood to be an illustrative example and should not be understood to be a preferred or advantageous example unless otherwise indicated.

Having thus described several aspects of at least one embodiment, it is to be appreciated that various alterations, modifications, and improvements will readily occur to those skilled in the art. Such alterations, modifications, and improvements are intended to be part of this disclosure and are intended to be within the spirit and scope of the principles described herein. Accordingly, the foregoing description and drawings are by way of example only.

What is claimed is:

1. A method, comprising:

estimating motion of a subject during a magnetic resonance image (MRI) scan based on each of a first slice and a second slice acquired during the MRI scan, the estimating comprising:

aligning each of the first slice and the second slice to a reference volume prior to acquiring a subsequent slice during the MRI scan, wherein the aligning comprises determining a first spatial transformation between the first slice and the reference volume and a second spatial transformation between the second slice and the reference volume, and determining a displacement between a result of each of the first spatial transformation and the second spatial transformation;

determining whether the displacement exceeds a threshold; and outputting an indication of the estimated motion of the subject based on the determining.

2. The method of claim 1, wherein the MRI scan comprises a functional MRI (fMRI) scan or a diffusion MRI scan.

3. The method of claim 1, wherein the slice is a first slice and wherein aligning the first slice to the reference volume comprises determining a degree of similarity between the first slice and a second slice formed from a plane of the reference volume.

4. The method of claim 3, wherein determining the degree of similarity between the first slice and the second slice comprises determining distances between local image patches.

5. The method of claim 1, further comprising acquiring a plurality of slices simultaneously, wherein:

the plurality of slices includes the first slice, and estimating the motion comprises aligning each of the plurality of slices to the reference volume in parallel.

6. The method of claim 1, further comprising generating the reference volume, the generating comprising:

acquiring a first volume comprising a first plurality of slices prior to acquiring a second volume comprising a second plurality of slices; and estimating motion between the first volume and the second volume.

7. The method of claim 6, wherein estimating the motion between the first volume and the second volume comprises aligning a slice of the second plurality of slices to the first volume.

8. The method of claim 6, further comprising determining that the first volume is the reference volume when the estimated motion between the first volume and the second volume does not exceed a threshold.

9. The method of claim 1, wherein outputting the indication of the estimated motion comprises outputting the indication during the MRI scan, prior to image reconstruction.

10. The method of claim 1, wherein outputting the indication of the estimated motion of the subject comprises recommending intervention when the estimated motion exceeds a threshold.

11. The method of claim 1, wherein outputting the indication of the estimated motion of the subject comprises recommending intervention to a scanner operator.

12. The method of claim 1, wherein outputting the indication of the estimated motion of the subject comprises displaying data through a user interface.

13. The method of claim 1, further comprising retrospectively correcting image data that results from the MRI scan based on the estimated motion.

14. The method of claim 1, further comprising prospectively correcting for the estimated motion during the MRI scan, prior to acquiring a subsequent slice.

15. The method of claim 1, further comprising updating parameters of the MRI scan based on the estimated motion, prior to acquiring subsequent slices.

16. A system, comprising: at least one processor; and at least one non-transitory computer-readable storage medium storing processor-executable instructions that, when executed by the at least one processor, cause the at least one processor to perform:

estimating motion of a subject during a magnetic resonance image (MRI) scan based on each of a first slice and a second slice acquired during the MRI scan, the estimating comprising:

aligning each of the first slice and the second slice to a reference volume prior to acquiring a subsequent slice during the MRI scan, wherein the aligning comprises determining a first spatial transformation between the first slice and the reference volume and a second spatial transformation between the second slice and the reference volume, and determining a displacement between a result of each of the first spatial transformation and the second spatial transformation;

determining whether the displacement exceeds a threshold; and outputting an indication of the estimated motion of the subject based on the determining.

17. A method, A magnetic resonance image (MRI) system, comprising:

an MRI scanner:

at least one computer hardware processor; and at least one non-transitory computer-readable storage medium storing processor executable instructions that, when executed by the at least one computer hardware processor, cause the at least one computer hardware processor to perform:

prior to acquiring a subsequent slice during a magnetic resonance image (MRI) scan, evaluating a first slice and a second slice acquired during the MRI scan, the evaluating comprising determining a first spatial transformation between the first slice and a reference volume and a second spatial transformation between the second slice and the reference volume and determining a displacement between the first spatial transformation and the second spatial transformation;

determining a quality of volumetric MRI data that would result from the MRI scan based at least in part on a result of evaluating the first slice and the second slice; and outputting an indication of the quality of the volumetric MRI data based on the determining the quality of volumetric MRI data.

18. A method, comprising:

estimating motion of a subject during a magnetic resonance image (MRI) scan based on a slice acquired during the MRI scan, the estimating comprising aligning the slice to a reference volume prior to acquiring a subsequent slice during the MRI scan, wherein the aligning comprises transforming the reference volume to a 3D space of the slice; and outputting an indication of the estimated motion of the subject.

* * * * *